(12) United States Patent  
Honda et al.

(10) Patent No.: US 8,854,517 B2
(45) Date of Patent: Oct. 7, 2014

(54) SOLID-STATE IMAGING DEVICE WITH STACKED SENSOR AND PROCESSING CHIPS

(75) Inventors: Katsumi Honda, Kanagawa (JP); Takafumi Takatsuka, Kanagawa (JP)

(73) Assignee: Sony Corporation (JP)

( * ) Notice: Subject to any disclaimer, the term of this patent is extended or adjusted under 35 U.S.C. 154(b) by 418 days.

(21) Appl. No.: 12/725,938

(22) Filed: Mar. 17, 2010

(65) Prior Publication Data

US 2010/0245647 A1    Sep. 30, 2010

(30) Foreign Application Priority Data

Mar. 24, 2009  (JP) ................................. 2009-072575
Jun. 29, 2009  (JP) ................................. 2009-153620

(51) Int. Cl.
| | |
|---|---|
| *H04N 5/335* | (2011.01) |
| *H04N 9/04* | (2006.01) |
| *H04N 5/376* | (2011.01) |
| *H01L 27/146* | (2006.01) |
| *H04N 5/374* | (2011.01) |
| *H04N 5/225* | (2006.01) |

(52) U.S. Cl.
CPC ............. *H04N 5/335* (2013.01); *H04N 5/3765* (2013.01); *H01L 27/14636* (2013.01); *H04N 5/374* (2013.01); *H04N 5/2257* (2013.01); *H01L 27/14627* (2013.01); *H01L 27/14634* (2013.01)
USPC .......................................... 348/308; 348/274

(58) Field of Classification Search
USPC .................. 348/294–308, 315, 275
See application file for complete search history.

(56) References Cited

U.S. PATENT DOCUMENTS

| 5,237,423 | A |  | 8/1993 | Goto et al. |
| 7,583,094 | B2 | * | 9/2009 | Hiroki ...................... 324/754.23 |
| 2003/0123106 | A1 | * | 7/2003 | Sawada ......................... 358/483 |
| 2003/0214595 | A1 | * | 11/2003 | Mabuchi ....................... 348/294 |
| 2004/0095495 | A1 | * | 5/2004 | Inokuma et al. .............. 348/308 |

(Continued)

FOREIGN PATENT DOCUMENTS

| EP | 1838088 | 9/2007 |
| JP | H04-324563 | 11/1992 |

(Continued)

OTHER PUBLICATIONS

European Search Report corresponding to European Serial No. 10002531 dated Jul. 20, 2010.

(Continued)

*Primary Examiner* — Tuan Ho
*Assistant Examiner* — Selam Gebriel
(74) *Attorney, Agent, or Firm* — Sheridan Ross P.C.

(57) ABSTRACT

A solid-state imaging device includes a first chip including a plurality of pixels, each pixel including a light sensing unit generating a signal charge responsive to an amount of received light, and a plurality of MOS transistors reading the signal charge generated by the light sensing unit and outputting the read signal charge as a pixel signal, a second chip including a plurality of pixel drive circuits supplying desired drive pulses to pixels, the second chip being laminated beneath the first chip in a manner such that the pixel drive circuits are arranged beneath the pixels formed in the first chip to drive the pixels, and a connection unit for electrically connecting the pixels to the pixel drive circuits arranged beneath the pixels.

23 Claims, 25 Drawing Sheets

(56) References Cited

U.S. PATENT DOCUMENTS

| | | |
|---|---|---|
| 2006/0023109 A1* | 2/2006 | Mabuchi et al. ............ 348/340 |
| 2008/0083939 A1* | 4/2008 | Guidash .................... 257/292 |
| 2008/0284888 A1 | 11/2008 | Kobayashi |
| 2010/0045835 A1* | 2/2010 | Matsunaga ................. 348/308 |

FOREIGN PATENT DOCUMENTS

| | | |
|---|---|---|
| JP | 2002-369078 | 12/2002 |
| JP | 2003-023573 | 1/2003 |
| JP | 2004-111590 | 4/2004 |
| JP | 2006-049361 | 2/2006 |
| JP | 2006049361 | 2/2006 |
| JP | 2006-135480 | 5/2006 |
| JP | 2007-208926 | 8/2007 |
| JP | 2008-521010 | 6/2008 |
| JP | 2008235478 | 10/2008 |
| JP | 2008-283331 | 11/2008 |
| JP | 2009-015964 | 1/2009 |
| JP | 2009-094273 | 4/2009 |
| JP | 2009-130827 | 6/2009 |
| JP | 2009170448 | 7/2009 |
| JP | 2010-244399 | 10/2010 |
| WO | WO 2006/129762 | 12/2006 |

OTHER PUBLICATIONS

Kurin H. et al., "Intelligent Image Sensor Chp with Three Dimensional Structure", Electron Devices Meeting, 1999, IEDM Technical Digest, International Washington, DC, Dec. 5-8, 1999, IEDM 19999, Dec. 5, 1999, pp. 879-882.

Fossum E. R. et al., :Infrared Readout electronics for Space Science Sensors: State of the Art and Future Directions Proceedings of the international Societ for Optical Engineering, vol. 2020, Jul. 12, 1993, pp. 262-285.

Hsieh, C. et al., "Focal-Plane Arrays and CMOS Readout Techniques of Infrared Imaging Systems", IEEE Transactions on Circuits and Systems for Video Technology, vol. 7, No. 4, Aug. 1, 1997.

Sony Corporation; JP Application No. 2009 072575; Japanese Office Action mailed Mar. 1, 2011; 3 pages.

Official Action (no English translation available) for Japanese Patent Application No. 2013-174634 mailed May 7, 2014, 6 pages.

* cited by examiner

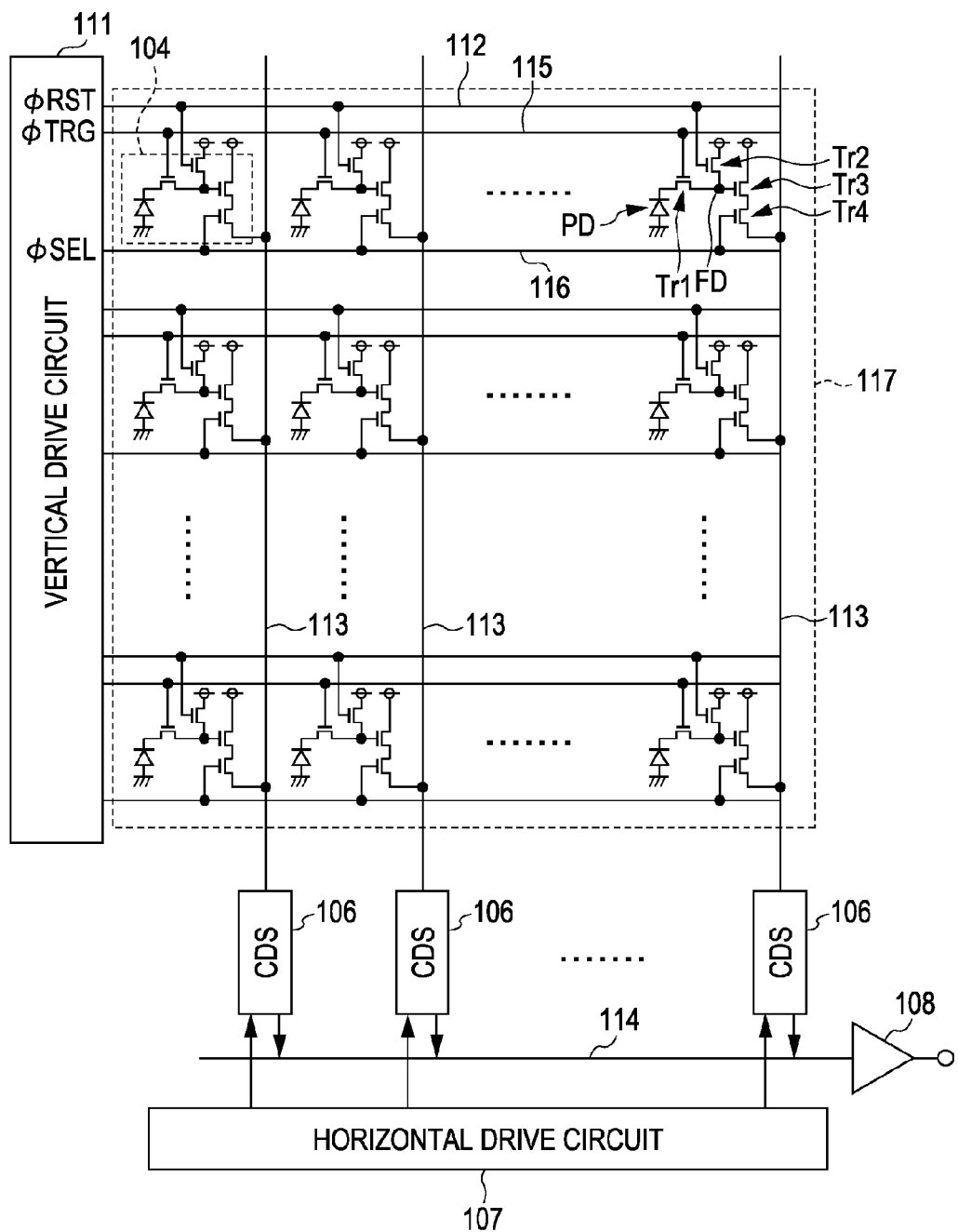
Prior Art FIG. 1

Prior Art FIG. 2
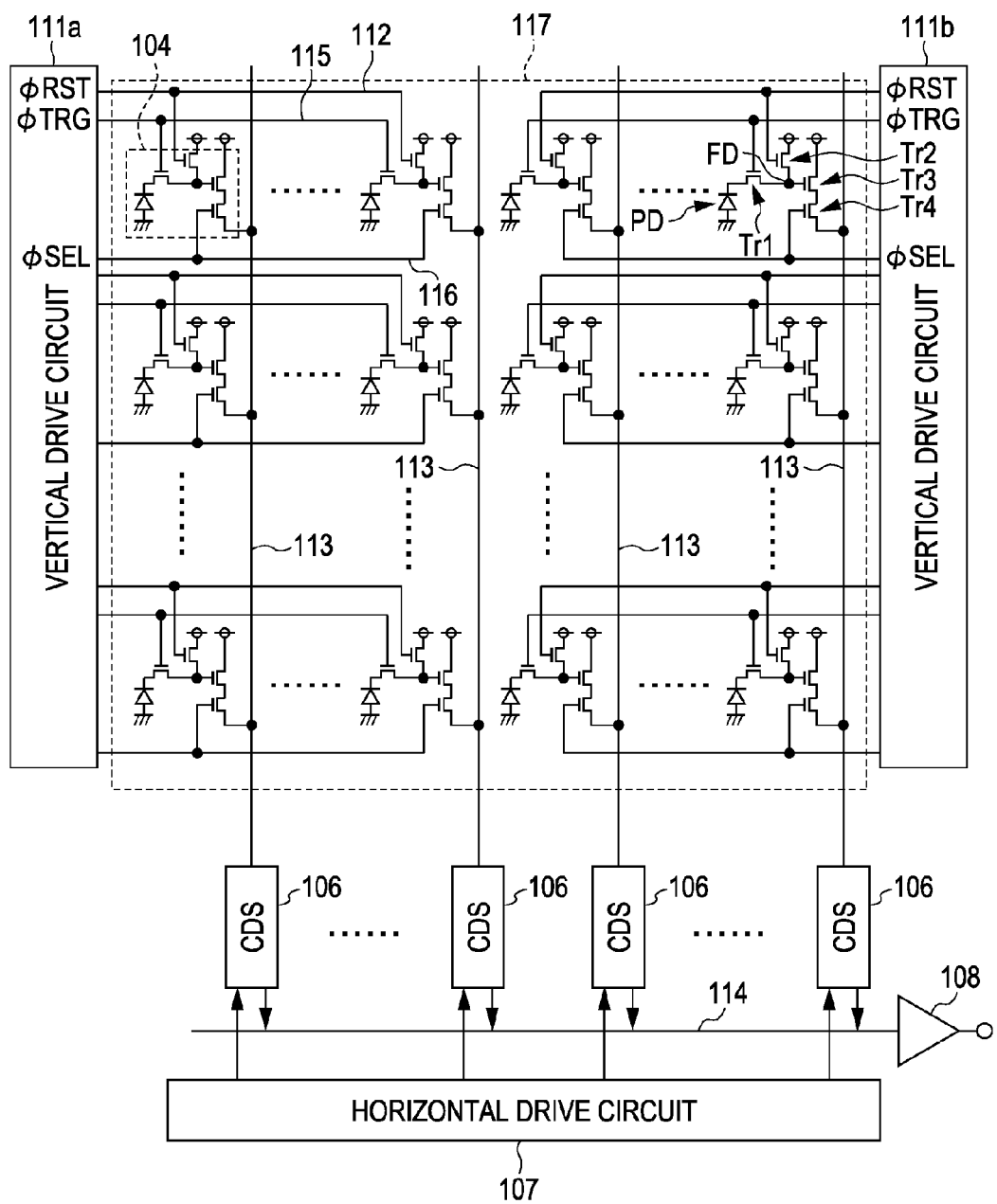

SOLID-STATE IMAGING DEVICE WITH STACKED SENSOR AND PROCESSING CHIPS

BACKGROUND OF THE INVENTION

1. Field of the Invention

The present invention relates to solid-state imaging devices, and in particular to a CMOS type solid-state imaging device and a drive method of the solid-state imaging device. The present invention also relates to an electronic apparatus including the solid-state imaging device.

2. Description of the Related Art

Video cameras and digital still cameras are in widespread use. Such a camera includes a charge-coupled device (CCD) solid-state imaging device or an amplified solid-state imaging sensor. The amplified solid-state imaging device guides a signal charge, generated and stored at a light sensing unit of each pixel, to an amplifier, and then outputs a signal, amplified by the amplifier in response to the signal charge, from the pixel. A plurality of such pixels are arranged in a matrix. The amplified solid-state imaging devices also include a solid-state imaging device having junction-type field effect transistors in the amplifier thereof, and a complementary metal oxide semiconductor (CMOS) solid-state imaging device having CMOS transistors in the amplifier thereof.

A typical CMOS solid-state imaging device reads successively on a per row basis a signal charge generated and stored on a photoelectric converter at each of the pixels arranged two-dimensionally in a matrix.

FIG. 1 generally illustrates a CMOS solid-state imaging device 100 of the related art. Referring to FIG. 1, the CMOS solid-state imaging device 100 includes a plurality of pixels 104 arranged on a substrate (not illustrated), vertical drive circuit 111, column signal processing circuit 106, horizontal drive circuit 107, output circuit 108, etc.

The vertical drive circuit 111 is arranged in a region adjacent to one side of a pixel module 117 having a plurality of pixels 104. The vertical drive circuit 111 includes a shift register, for example, and outputs a transfer pulse φTRG, a the reset pulse φRST, and a selection pulse φSEL for selectively scanning the pixels 104 of the pixel module 117 in a vertical direction on a per row basis.

The column signal processing circuit 106 is arranged at the final stage of the vertically aligned pixels 104, i.e., at each vertical column of the pixels 104. The column signal processing circuit 106 performs signal processing operations, including a noise removal operation and a signal amplification operation on the signals output from one row of pixels 104 in response to a signal from a black reference level pixel area (not illustrated but arranged surrounding effective pixels) on a per pixel column basis.

The horizontal drive circuit 107, including a shift register, for example, successively outputs a horizontal scan pulse. The horizontal drive circuit 107 thus successively selects the column signal processing circuits 106 and causes the selected column signal processing circuit 106 to output a pixel signal to a horizontal signal line 114.

The output circuit 108 performs a signal processing operation on signals successively supplied from the column signal processing circuits 106 via the horizontal signal line 114.

The pixel 104 includes a light sensing unit PD having a photodiode, and a plurality of MOS transistors. The pixel 104 here includes four MOS transistors of a transfer transistor Tr1, a reset transistor Tr2, an amplifying transistor Tr3, and a selection transistor Tr4. Optionally, the pixel 104 may include three transistors, i.e., the transfer transistor Tr1, the reset transistor Tr2, and the amplifying transistor Tr3, excluding the selection transistor Tr4.

The transfer transistor Tr1 receives the transfer pulse φTRG via a line 115 from the vertical drive circuit 111. In response to the transfer pulse φTRG, the transfer transistor Tr1 transfers a signal charge stored at the light sensing unit PD to a floating diffusion region FD. The reset transistor Tr2 receives the reset pulse φRST via a line 112 from the vertical drive circuit 111. In response to the reset pulse φRST, the reset transistor Tr2 resets the voltage at the floating diffusion region FD to a voltage close to a power source voltage VDD. A signal voltage responsive to the voltage at the floating diffusion region FD is applied to the gate of the amplifying transistor Tr3 and is thus amplified by the amplifying transistor Tr3. The selection transistor Tr4 receives the selection pulse φSEL via a line 116 from the vertical drive circuit 111. In response to the selection pulse φSEL, the selection transistor Tr4 outputs the signal voltage amplified by the amplifying transistor Tr3 to a vertical signal line 113 as a pixel signal.

Referring to FIG. 1, the CMOS solid-state imaging device 100 includes the vertical drive circuit 111 on one side only of the pixel module. In a pixel 104 far apart from the vertical drive circuit 111 (i.e., a pixel 104 at the side opposite the side having the vertical drive circuit 111), a supplied drive pulse is subject to a delay and a wave deformation because of a wiring resistance and a parasitic capacitance between adjacent wiring lines. As the number of pixels 104 increases (for fine picture), the number of pixels to be driven also increases. The problem of resistance and parasitic capacitance is not ignored. The driving of the pixels 104 at high speed becomes difficult.

As illustrated in FIG. 2, the vertical drive circuits 111a and 111b are arranged on both sides of the pixel module so that the pixels 104 are driven from both sides. As illustrated in FIG. 2, like elements are designated with like reference numerals, and the discussion thereof is omitted.

The solid-state imaging device illustrated in FIG. 2 includes the vertical drive circuits 111a and 111b on both sides of the pixel module 117. The pixels 104 on the left half of the pixel module 117 are driven by the vertical drive circuit 111a arranged on the left side of the pixel module 117 while the pixels 104 on the right half of the pixel module 117 are driven by the vertical drive circuit 111b arranged on the right side of the pixel module 117.

In the arrangement illustrated in FIG. 2, pixels 104 in the center of the pixel module 117 are far apart from the vertical drive circuits 111a and 111b, the drive pulse is subject to delay and waveform deformation. It is difficult to drive the pixel 104s at a high speed.

A concurrent imaging function (global shutter function) has been recently proposed to achieve a concurrent storage of signal charge in a CMOS type solid-state imaging device. The application field of the CMOS solid-state imaging device having the global shutter function has become widespread.

To achieve the global shutter function, the CMOS solid-state imaging device supplies concurrently transfer pulses to all the pixels, and reads concurrently the signal charges from all the pixels. In the solid-state imaging device in the related art, a drive pulse to be supplied to a pixel far apart from the vertical drive circuit is subject to delay and waveform deformation. It is difficult to drive concurrently all the pixels, and if a high-speed operation is performed, pixel blurring takes place.

Japanese Unexamined Patent Application Publication No. 2006-49361 discloses a structure that increases a pixel processing speed. According to the disclosure, a CMOS type solid-state imaging device is connected via a micro bump to a signal processing chip having a signal processing circuit for processing a pixel signal output from the CMOS type solid-state imaging device. In this structure, a pixel far apart from a vertical drive circuit is still subject to pulse delay and pulse deformation, and drive synchronization of the pixels is not achieved.

The pixel module of the solid-state imaging device is configured in an array of rows and columns of pixels. Since the pixel module is configured in an array structure, a circuit for driving pixels and for reading a signal is typically as a cyclic layout pattern circuit that is cyclically repeated in a vertical direction (in a direction of row arrangement) or in a horizontal direction (in a direction of column arrangement) in accordance with the array of pixels.

The cyclic layout pattern circuit is subject to a delay in the timings of activation and deactivation of a signal depending on the pixel position in the vertical direction or the horizontal direction. Such delay is due to a difference in parasitic resistance and parasitic capacitance dependent on a wiring line length, or due to a difference in an IR drop dependent on a distance from a power source. The IR drop is a voltage drop caused along a power source line and determined by the product of a current I and a resistance R.

If a delay takes place in the timings of activation and deactivation of the signal depending on the pixel position in the vertical direction or the horizontal direction, shading and lack of synchronization may take place in the vertical direction and the horizontal direction. To prevent the generation of shading, the activation and deactivation timings are preferably tuned on a per row basis or a column basis.

The parasitic resistance and the parasitic capacitance of the wiring line and the threshold value of each transistor of the cyclic layout pattern circuit vary from chip to chip. The activation and deactivation timings of the signal also vary from chip to chip. An amount of correction for the shading and synchronization also differs from chip to chip.

Without tuning correction on a per chip basis, design specifications are to be determined taking into consideration tailed distribution. Such a consideration is expected to lower production yield. To this end, the activation and deactivation times of the signal on a per chip basis are tuning corrected.

A tuning correction method of a characteristic value of a solid-state imaging device is disclosed in Japanese Unexamined Patent Application Publication No. 2007-208926, for example. In accordance with the disclosure, recommended characteristic information stored on a non-volatile memory arranged on the same chip as the chip of the device or on the same package as the package of the device is used.

With the technique in the related art, the recommended characteristic information related to a drive voltage range or a power source voltage fluctuation is written onto the non-volatile memory beforehand. A device manufacturer then reads the characteristic information written on the non-volatile memory through an outside terminal, and then individually adjusts the power source voltage in accordance with the characteristic information.

SUMMARY OF THE INVENTION

It is thus desirable to provide a solid-state imaging device that drives pixels at a high speed with concurrency property maintained, and with pixel blurring reduced. It is also desirable to provide an electronic apparatus including the solid-state imaging device.

The technique of the related art disclosed in Japanese Unexamined Patent Application Publication No. 2007-208926 is based on a limited amount of information related to fault information and characteristic information of the solid-state imaging device. The number of terminals (pins) for inputting information to and outputting information from the non-volatile memory is too small. With this arrangement, a multi-point tuning correction operation for respective rows or columns of the pixel array or for respective a group of rows or columns of the pixel array is not supported.

In a system-on-chip (SOC) structure, a solid-state imaging device and an adjustment circuit including a non-volatile memory may be arranged on the same substrate. This structure allows the solid-state imaging device and the non-volatile memory to be internally connected rather than via outside terminals which are subject to a limitation in the number thereof. This arrangement appears to accommodate the multi-point tuning correction function.

To write information, however, the non-volatile memory typically operates from a voltage as high as 10 to 20 V. On the other hand, the solid-state imaging device typically operates from a voltage as low as 3 to 5 V. If the solid-state imaging device operating from the low voltage and the adjustment circuit including the non-volatile memory operating from the high voltage co-exist on the same substrate, the solid-state imaging device may be adversely affected in terms of withstand voltage consideration. The mounting of such elements becomes difficult in view of a manufacturing process.

It is thus desirable to provide a solid-state imaging device that performs a multi-point tuning correction operation on all the rows or the columns of pixels, on every predetermined number of rows or columns of pixels, and is free from a manufacturing process difficulty such as a difficulty to implement a high withstand voltage rating characteristic of the SOC structure.

A solid-state imaging device according to one embodiment of the present invention includes a first chip having a plurality pixels and a second chip having a pixel drive circuit for driving the pixels.

The pixel includes a light sensing unit generating a signal charge responsive to an amount of received light, and a plurality of MOS transistors reading the signal charge generated by the light sensing unit and outputting the read signal charge as a pixel signal. The pixels are arranged in the first chip.

The second chip includes a plurality of pixel drive circuits supplying desired drive pulses to the pixels.

The second chip is laminated beneath the first chip in a manner such that the pixel drive circuits are arranged beneath the pixels formed in the first chip to drive the pixels. The first chip and the second chip are electrically connected to each other via a connection unit for electrically connecting the pixels to the pixel drive circuits arranged beneath the pixels.

In the solid-state imaging device, each pixel is driven by the drive pulse supplied from the pixel drive circuit arranged beneath the pixel. With this arrangement, a delay and waveform distortion in the drive pulse supplied to each pixel are controlled, and a high-speed operation is performed.

A method of driving the solid-state imaging device includes starting concurrently an exposure operation on all the pixels, stopping concurrently the exposure operation on all the pixels, and then reading onto charge storage capacitance units the signal charges generated on the light sensing units of the pixels. The method further includes inputting a drive pulse to a predetermined pixel from the pixel drive circuit arranged beneath the predetermined pixel and outputting as the pixel signal the signal charge stored on the charge storage capacitance unit of the predetermined pixel.

In accordance with the driving method of the solid-state imaging device, a delay and waveform distortion in the drive pulse supplied to each pixel are controlled, and a high-speed operation is performed. Pixel blurring is controlled with a global shutter function implemented.

An electronic apparatus according to one embodiment of the present invention includes an optical lens, the solid-state imaging device, and a signal processing circuit for processing a signal output from the solid-state imaging device.

According to one embodiment of the present invention, a method of driving a solid-state imaging device is disclosed. The solid-state imaging device includes a first chip including a cyclic layout pattern circuit having unit circuits cyclically arranged in a regular pattern in at least one of a row direction along which rows of pixels of a pixel array having a matrix of rows and columns of pixels, each pixel including a photoelectric converter, are arranged, and a column direction along which columns of pixels of the pixel array are arranged, a second chip laminated on the first chip, the second chip including an adjustment circuit, the adjustment circuit including a storage unit and a plurality of unit circuits corresponding to the unit circuits of the cyclic layout pattern circuit, and a connection unit for electrically connecting each unit circuit of the cyclic layout pattern on the first chip to each unit circuit of the adjustment circuit on the second chip in a mapped relationship. The method includes adjusting a timing of a signal of each unit circuit of the cyclic layout pattern circuit on a per unit circuit basis of the adjustment circuit.

Since the first and second chips are laminated, the electrical connection between the two chips can have a three-dimensional structure. In the cyclic layout pattern circuit, a difference in parasitic resistance and parasitic capacitance dependent on a wiring line length, or a difference in an IR drop dependent on a distance from a power source cause a delay in the timings of activation and deactivation of a signal depending on the pixel position in the vertical direction or the horizontal direction. A signal delayed in the activation and deactivation timings is input to the unit circuit corresponding to a unit circuit on the adjustment circuit on the second chip.

The signal having suffered from a delay in the activation and deactivation timings is individually adjusted (tuning corrected) in timing in accordance with stored data on the storage unit in the unit circuit on the adjustment circuit. The timing adjustment sets the activation and deactivation timings to be concurrent. The signal to each unit circuit on the cyclic layout pattern circuit is finally set free from delay.

Since the delay and the waveform deformation in the drive pulse driving the pixel are controlled, a high-speed operation having concurrency in the driving of the pixels is performed, and pixel blurring is reduced.

Since the electrical connection between the first and second chips has a three-dimensional structure, the limitation to the number of connection terminals is eliminated. The multipoint tuning correction operation can be performed on a per row basis, on a per column basis, on a row group basis, or on a column group basis. Since the cyclic layout pattern circuit operating from a low voltage and the adjustment circuit including the storage unit operating from a high voltage are arranged on separate chips, the manufacturing process is free from a difficulty to implement a high withstand voltage rating characteristic of the SOC structure.

BRIEF DESCRIPTION OF THE DRAWINGS

FIG. 1 generally illustrates a solid-state imaging device of the related art;

FIG. 2 generally illustrates a solid-state imaging device of the related art;

DESCRIPTION OF THE PREFERRED EMBODIMENTS

A solid-state imaging device, a manufacturing method thereof, and an electronic apparatus of embodiments of the present invention are described below with reference to FIGS. 3A and 3B through 14. The present invention is not limited to the embodiments described below.

1. First Embodiment
1.1 Structure of Solid-State Imaging Device

Figure 3A:
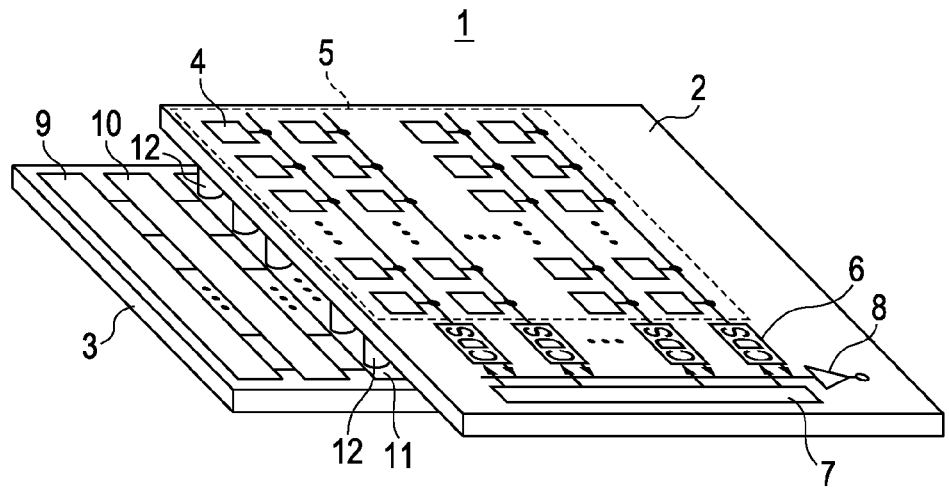
FIG. 3A is a perspective view diagrammatically illustrating a solid-state imaging device of a first embodiment of the present invention.
Figure 3B:
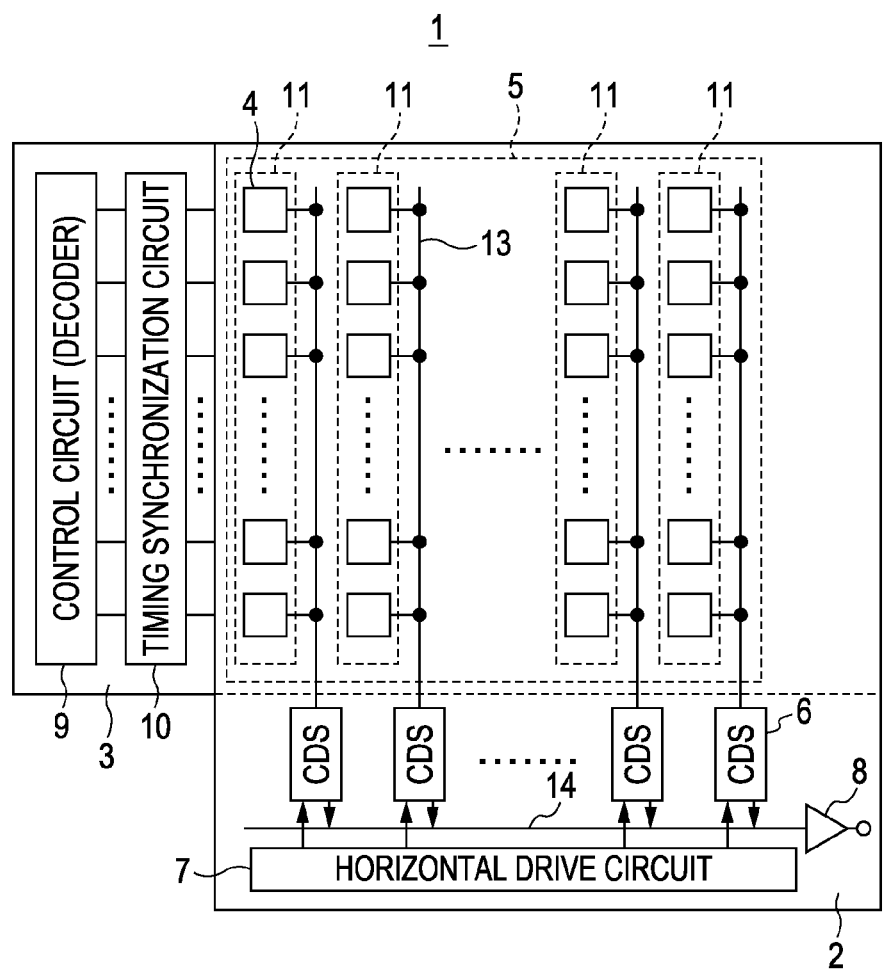
FIG. 3B is a block diagram illustrating the solid-state imaging device of the first embodiment of the present invention.

FIG. 3A is a perspective view diagrammatically illustrating a solid-state imaging device 1 of a first embodiment of the present invention, and FIG. 3B is a block diagram illustrating the solid-state imaging device 1 of the first embodiment of the present invention.

The solid-state imaging device 1 includes first chip 2, second chip 3, pixels 4, pixel module 5, column signal processing circuits 6, horizontal drive circuit 7, output circuit 8, control circuit 9, timing synchronization circuit 10, pixel drive circuit 11, connection units 12, vertical signal lines 13, horizontal signal line 14, and substrate 15. The pixel 4 includes light sensing unit 16, floating diffusion unit 17, a charge storage capacitance 17a, a floating diffusion region 17b, impurity regions 18, 19, and 20, gate electrodes 21, 21a, 21b, 22, 22a, 22b, 23, and 24, gate insulator 25, a plurality of wiring layers 26, interlayer insulator 27, wiring layers 28, color filter layer 29, on-chip microlens 30, contact members 31, 32, and 33, micro pads 34, and micro bumps 35.

Referring to FIG. 3A, the solid-state imaging device 1 includes the first chip 2 arranged on a light incident side of the second chip 3 and the second chip 3 arranged on the side opposite the light incident side and laminated beneath the first chip 2. The first chip 2 includes a plurality of pixels 4 and the second chip 3 includes a plurality of pixel drive circuits 11. Referring to FIG. 4B, the first chip 2 and the second chip 3 are laminated together so that one pixel drive circuit 11 extending vertically comes beneath one column of pixels 4 (right beneath one column of pixels 4 in the first embodiment).

The first chip 2 and the second chip 3 laminated in this way are connected via the connection units 12 as illustrated in FIG. 3A in a manner such that the pixels 4 are electrically connected to the pixel drive circuits 11.

Figure 4A:
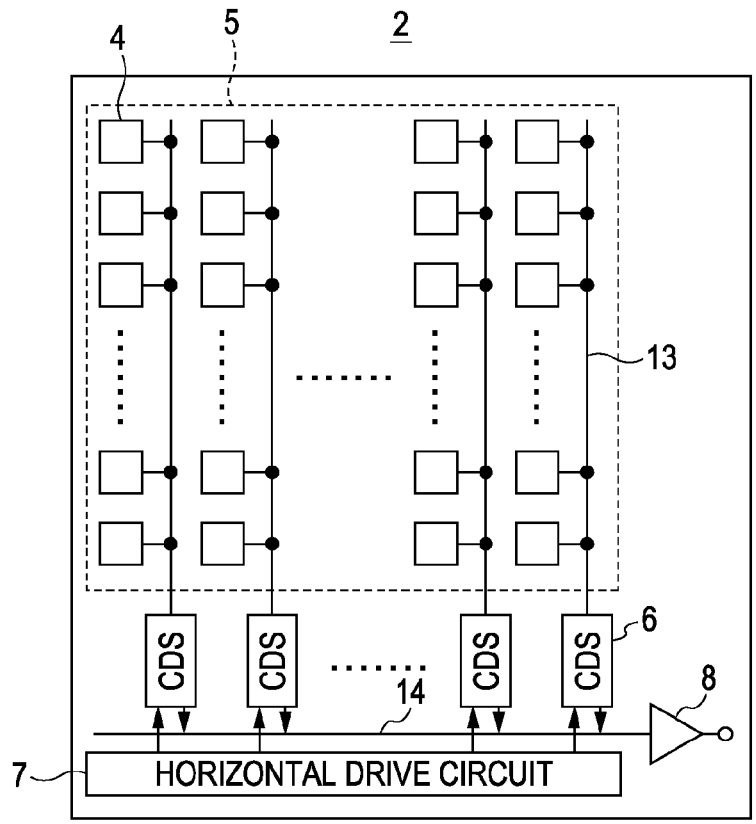
FIG. 4A is a block diagram diagrammatically illustrating a first chip.
Figure 4B:
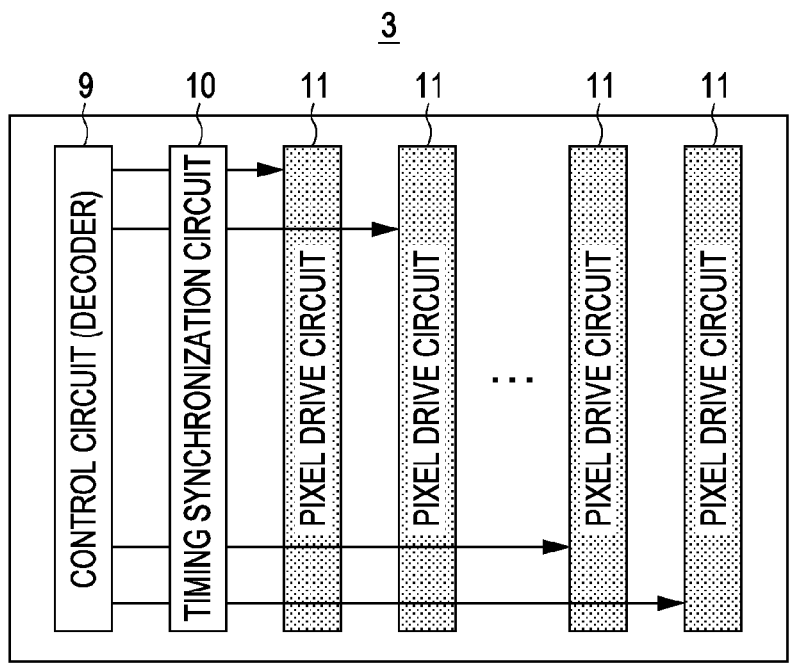
FIG. 4B is a block diagram diagrammatically illustrating a second chip.

FIG. 4A is a block diagram diagrammatically illustrating the first chip 2, and FIG. 4B is a block diagram diagrammatically illustrating the second chip 3. The second chip 3 and the second chip 3 are described with reference to FIGS. 4A and 4B.

Referring to FIG. 4A, the first chip 2 includes a pixel module 5 including a plurality of pixels 4, the column signal processing circuits 6, the horizontal drive circuit 7, and the output circuit 8.

The pixel 4 generates a light sensing unit generating and storing a signal charge responsive to an amount of received light, and a plurality of MOS transistors reading the signal charge stored on the light sensing unit and outputting the read signal charge as a pixel signal. The pixels 4 are arranged in a two-dimensional array in a regular pattern. The MOS transistors for the pixel 4 may be four transistors of a transfer transistor, a reset transistor, a selection transistor, and an amplifying transistor or three transistors of the four transistors excluding the selection transistor. As will be described later, the MOS transistors are four transistors of the transfer transistor, the reset transistor, the selection transistor, and the amplifying transistor in accordance with the first embodiment.

The pixel module 5 includes a plurality of pixels 4 arranged in a two-dimensional array in a regular pattern. The pixel module 5 includes an effective pixel area (not illustrated) that actually receives light, photoelectrically converts an amount of light into a signal charge, amplifies the signal charge, and reads the signal charge to the column signal processing circuit 6, and a black reference level pixel area (not illustrated) that is formed around the effective pixel area and outputs an optical black signal serving as a black level.

The column signal processing circuit 6 is arranged for each column of the pixels 4, and performs signal processing operations, including a noise removal operation and a signal amplification operation on the signal output from one row of pixels 104 in response to a signal from the black reference level pixel area (not illustrated but arranged surrounding the effective pixel area) on a per pixel column basis. A horizontal selection switch (not illustrated) is arranged at an output stage of the column signal processing circuit 6 connected to the horizontal signal line 14.

The horizontal drive circuit 7, including a shift register, successively outputs a horizontal scanning pulse, thereby successively selecting the column signal processing circuits 6. The horizontal drive circuit 7 thus causes each column signal processing circuit 6 to output a pixel signal to the horizontal signal line 14.

The output circuit 8 performs a signal process on the signals successively output from the column signal processing circuits 6 via the horizontal signal line 14.

As illustrated in FIG. 4B, the second chip 3 includes a plurality of pixel drive circuits 11, and the control circuit 9 and the timing synchronization circuit 10 formed around the pixel drive circuits 11.

The control circuit 9, including a decoder, decodes an address signal input from an address generator circuit (not illustrated), and supplies a decode signal to the timing synchronization circuit 10.

The timing synchronization circuit 10 outputs to the pixel 4 selected in response to the decode signal a timing signal driving each MOS transistor. The timing signal output from the timing synchronization circuit 10 is input to each of the pixel drive circuits 11.

The pixel drive circuits 11 are arranged in a manner such that one pixel drive circuit 11 corresponds to one pixel column of vertically arranged pixels on the pixel module 5 on the first chip 2. The pixel drive circuit 11 supplies a desired MOS transistor of the corresponding pixel 4 with a desired drive pulse in response to the timing signal from the timing synchronization circuit 10.

The second chip 3 thus constructed is laminated beneath the first chip 2 so that one pixel drive circuit 11 comes beneath one corresponding pixel column formed on the first chip 2.

In the first chip 2 and second chip 3 thus constructed, the pixels 4 and the pixel drive circuit 11 arranged right beneath the pixels 4 are connected via the connection units 12. In the solid-state imaging device 1 of the first embodiment, each pixel 4 is connected to the pixel drive circuit 11 right beneath the pixel 4 via the connection unit 12.

1.2 Cross-Sectional Structure of the Solid-State Imaging Device

The structure of the connection unit 12 between the pixels 4 and the pixel drive circuit 11 is described below in detail.

Figure 5:
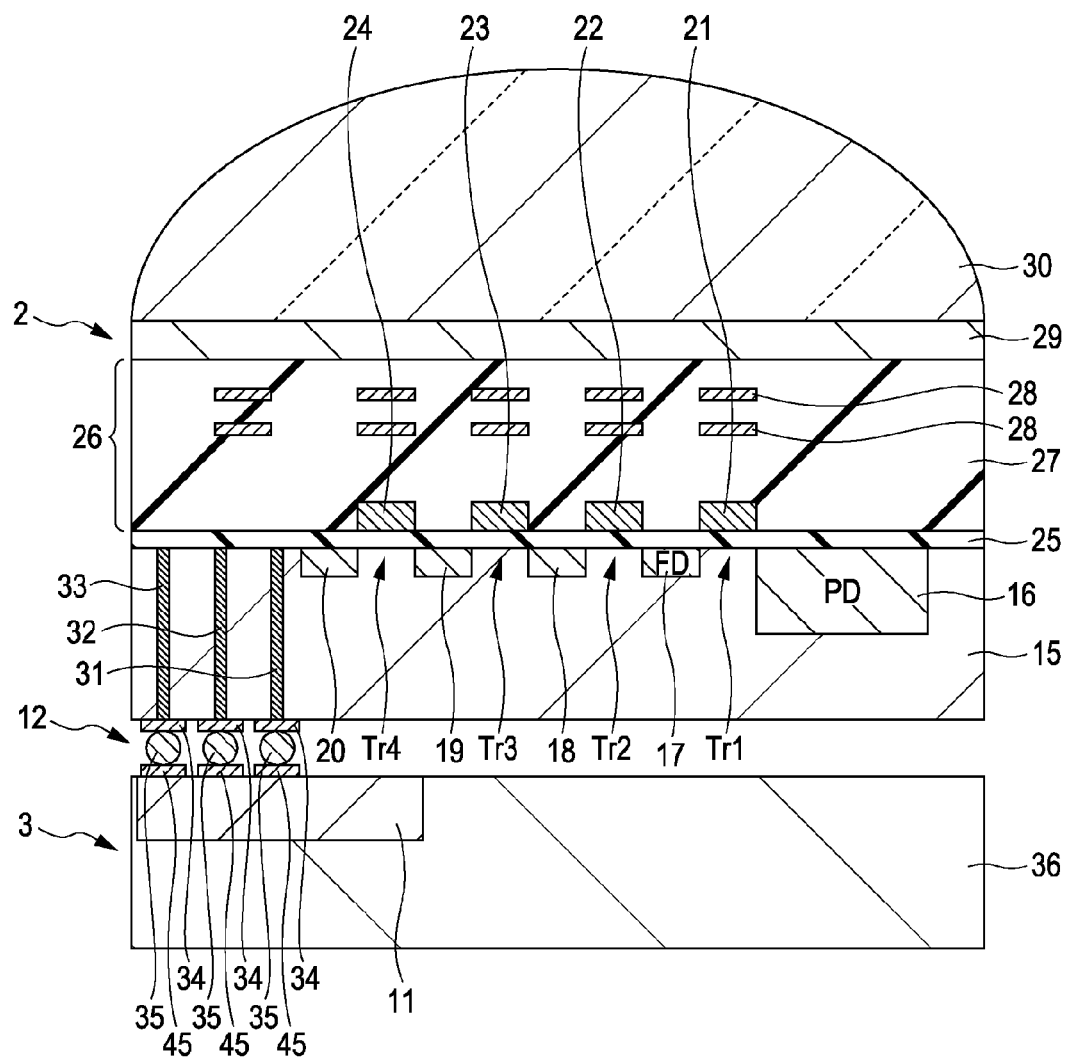
FIG. 5 is a sectional view diagrammatically illustrating a pixel formed in the first chip, a pixel drive circuit formed in the second chip, and a connection unit of the first and second chips in the solid-state imaging device of the first embodiment.

FIG. 5 is a sectional view diagrammatically illustrating a pixel 4 formed on the first chip 2, the pixel drive circuit 11 formed on the second chip 3, and the connection unit 12. FIG. 5 illustrates the cross section of one pixel.

Referring to FIG. 5, the first chip 2 includes the substrate 15 having the light sensing unit 16, the wiring layers 26, the color filter layer 29, and the on-chip microlens 30.

The substrate 15 is a semiconductor substrate made of silicon. Arranged in the top side of the substrate 15 serving as a light incident side are the floating diffusion unit 17, and the impurity regions 18, 19, and 20 forming sources and drains of the MOS transistors.

The light sensing unit 16 includes a photodiode. The floating diffusion unit 17 is formed of an impurity region in an area adjacent to the light sensing unit 16. The impurity regions 18, 19, and 20 are formed on a desired area in the top side of the substrate 15.

The wiring layers 26 are formed on the light incident side of the substrate 15. The wiring layers 26 include the gate electrodes 21, 22, 23, and 24 forming the respective MOS transistors with the gate insulator 25 on the substrate 15. The gate electrode 21 formed over and between the light sensing unit 16 and the floating diffusion unit 17 in the substrate 15 serves as a gate electrode of a transfer transistor Tr1. The gate electrode 22 formed over and between the floating diffusion unit 17 and the impurity region 18 in the substrate 15 serves as a gate electrode of a reset transistor Tr2. The gate electrode 23 formed over and between the impurity region 18 and the impurity region 19 in the substrate 15 serves as a gate electrode of an amplifying transistor Tr3. The gate electrode 24 formed over and between the impurity region 19 and the impurity region 20 in the substrate 15 serves as a gate electrode of a selection transistor Tr4. A plurality of wiring layers 28 (two layers in the first embodiment) are arranged in the interlayer insulator 27 covering the gate electrodes 21, 22, 23, and 24.

The color filter layer 29 is arranged on the wiring layers 26. For example, a red color filter, a green color filter, and a blue color filter are arranged on a per pixel basis.

The on-chip microlens 30 is arranged on the color filter layer 29 and efficiently collects incident light onto the light sensing unit 16.

The substrate 15 having the first chip 2 includes three contact members 31, 32, and 33 passing through the substrate 15 from the top side to the bottom side thereof. The contact member 31 is electrically connected to the gate electrode 21 of the transfer transistor Tr1 via the wiring layer 28 of the plurality of wiring layers 26. The contact member 32 is electrically connected to the gate electrode 22 of the reset transistor Tr2 via the wiring layer 28 of the wiring layers 26. The contact member 33 is electrically connected to the gate electrode 24 of the selection transistor Tr4 via the wiring layer 28 of the wiring layers 26.

Since the contact members 31, 32, and 33 are extended to the bottom side of the substrate 15 via the micro pad 34 formed on the bottom side of the substrate 15.

The floating diffusion unit 17 is connected to the gate electrode 23 of the amplifying transistor Tr3 via the wiring layer 28 in the first chip 2 although this connection is not illustrated in FIG. 5. The impurity region 18 is connected to the power source Vdd. The impurity region 20 is connected to the vertical signal line formed of the wiring layer 28.

The pixel drive circuit 11 is formed in a substrate 36 in the second chip 3. Lines (not shown) forming the pixel drive circuit 11 are extended via micro pads 45 to the side of the substrate 36 facing the first chip 2. In accordance with the first embodiment, the lines supplying a transfer pulse, a reset pulse, and a selection pulse extend from the pixel drive circuit 11 to the micro pads 45 on the substrate 36.

In the connection unit 12, the micro pad 34 on the first chip 2 is connected to the micro pad 45 on the second chip 3 via the micro bump 35. The pixels 4 formed on the first chip 2 are electrically connected to the pixel drive circuit 11 on the second chip 3 in this way. The transfer pulse generated by the pixel drive circuit 11 is supplied to the gate electrode 21 of the transfer transistor Tr1 via the contact member 31 and the wiring layer 28. The reset pulse generated by the pixel drive circuit 11 is supplied to the gate electrode 22 of the reset transistor Tr2 via the contact member 32 and the wiring layer 28. The selection pulse generated by the pixel drive circuit 11 is supplied to the gate electrode 24 of the selection transistor Tr4 via the contact member 33 and the wiring layer 28.

In the solid-state imaging device 1 of the first embodiment, the pixels 4 formed on the first chip 2 are connected to the pixel drive circuits 11 formed right beneath the pixels 4 via the connection unit 12 produced through micro bonding.

1.3 Circuit Arrangement of the Solid-State Imaging Device

Figure 6:
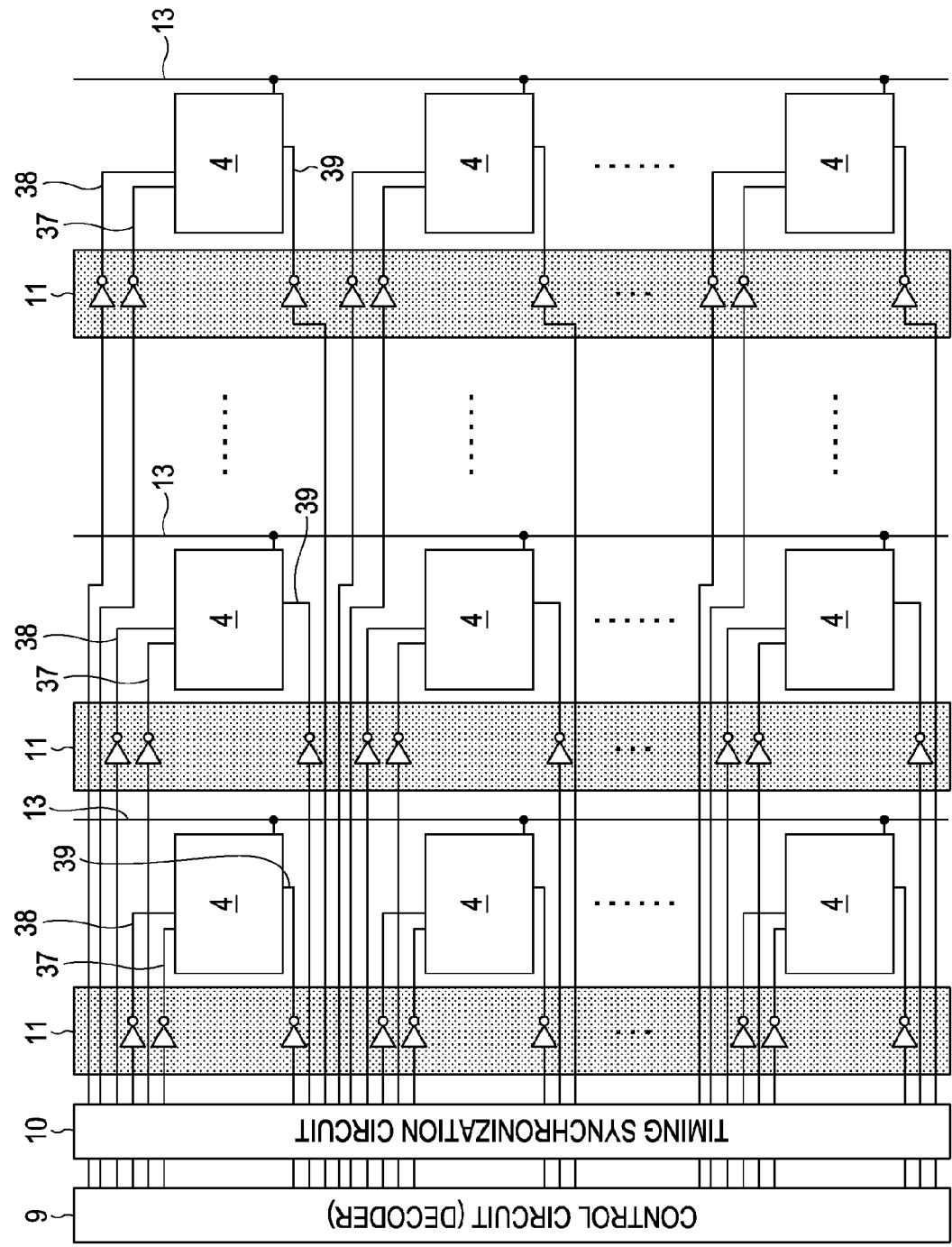
FIG. 6 is a block diagram illustrating an electrical connection of a pixel module in the solid-state imaging device of the first embodiment.

FIG. 6 is a block diagram illustrating an electrical connection of the pixel module 5 in the solid-state imaging device 1 of the first embodiment. Referring to FIG. 6, the pixel drive circuits 11 generate the transfer pulses, the reset pulses, and the selection pulses of the corresponding pixels 4 in response to the timing signal from the timing synchronization circuit 10. The pixel drive circuit 11 then supplies the transfer pulses, the reset pulses, and the selection pulses to the corresponding pixels 4 via transfer lines 37, reset lines 38, and selection lines 39.

Figure 7:
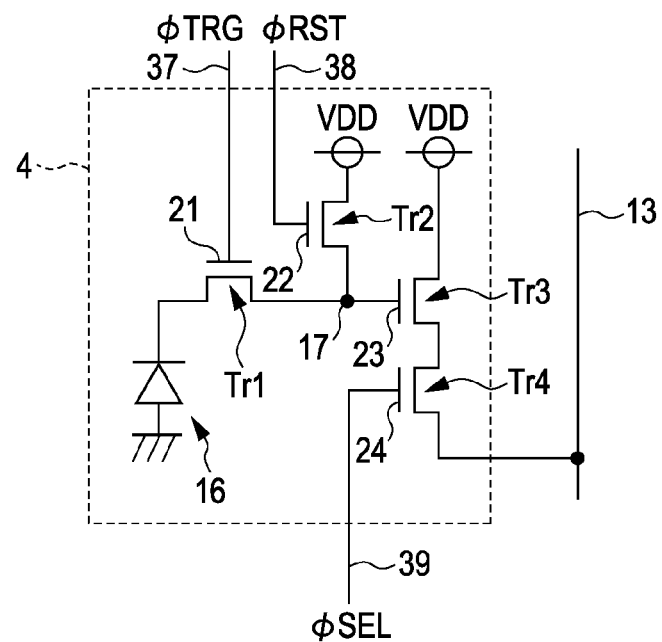
FIG. 7 is an equivalent circuit diagram of each pixel.

FIG. 7 is an equivalent circuit diagram of each pixel. As illustrated in FIG. 7, the anode of the light sensing unit 16 including a photodiode is grounded in the pixel 4 in the solid-state imaging device 1 of the first embodiment, and the cathode of the light sensing unit 16 is connected to the source of the transfer transistor Tr1. The drain of the transfer transistor Tr1 serves as the floating diffusion unit 17 and the transfer line 37 supplying a transfer pulse $\phi$TRG is connected to the gate electrode 21 of the transfer transistor Tr1.

The reset transistor Tr2 has the source thereof serving as the floating diffusion unit 17 and the drain thereof supplied with the power source voltage VDD. The reset line 38 supplying a reset pulse $\phi$RST is connected to the gate electrode 22 of the reset transistor Tr2.

The floating diffusion unit 17 is also connected to the gate electrode 23 of the amplifying transistor Tr3 and the source of the gate electrode 23 is supplied with the power source voltage VDD. The amplifying transistor Tr3 has the drain thereof connected to the source of the selection transistor Tr4.

The selection transistor Tr4 has the drain thereof connected to the vertical signal line 13, and the gate electrode 24 thereof connected to the selection line 39 supplying a selection pulse $\phi$SEL.

In the solid-state imaging device 1 of the first embodiment, the transfer lines 37, the reset lines 38, and the selection lines 39 in the pixels 4 are connected to different pixel drive circuits 11 on a per pixel column basis. Since the pixel 4 is connected to the pixel drive circuit 11 arranged right therebeneath via the connection unit 12 as previously discussed, the transfer lines 37, the reset lines 38, and the selection lines 39 in all the pixels 4 are connected to the pixel drive circuits 11 closest to the pixels 4 (right beneath the pixels 4).

In the solid-state imaging device 1 thus constructed, the signal charge generated and stored through the photoelectric conversion operation of the light sensing unit 16 is read onto the floating diffusion unit 17 in response to the transfer pulse φTRG supplied to the gate electrode 21. When the signal charge is read onto the floating diffusion unit 17, a change in the voltage of the floating diffusion unit 17 occurs. A signal voltage responsive to the voltage change is supplied to the gate electrode 23 of the amplifying transistor Tr3. The signal voltage amplified by the amplifying transistor Tr3 is output to the vertical signal line 13 as a pixel signal. As illustrated in FIGS. 1A and 1B, the pixel signal output to the vertical signal line 13 is supplied to the horizontal signal line 14 via the column signal processing circuit 6 formed in the first chip 2 and then output through the output circuit 8.

The solid-state imaging device 1 of the first embodiment includes the pixel drive circuit 11 right beneath the pixels 4 therefor, and the pixels 4 are thus driven by the pixel drive circuit 11 right therebeneath. Since a distance between the pixels 4 and the pixel drive circuit 11 generating the drive pulses driving the pixels 4 is short, a wiring resistance and a parasitic capacitance created between adjacent wiring lines are substantially reduced. The drive pulse generated by the pixel drive circuit 11 is thus transferred to the pixels 4 without delay.

Since the pixels 4 are supported by the pixel drive circuit 11 on a per pixel column basis, a drive power of the pixel drive circuit 11 can be reduced. Each MOS transistor forming the pixel 4 having a lower withstand voltage rating can thus be used. Since the pixel drive circuit 11 having a low drive power works, the performance of the MOS transistors in terms of withstand voltage is increased.

The solid-state imaging device 1 of the first embodiment can also perform a decimation drive operation in which a signal charge is read with predetermined pixels 4 skipped. More specifically, the pixels 4 are driven by drive pulses supplied from different pixel drive circuits 11, and desired ones of the pixels 4 are selectively driven.

The solid-state imaging device 1 can perform a drive control operation on a per pixel basis or a pixel group basis, which has been considered difficult in the related art.

In the solid-state imaging device 1 of the first embodiment, the pixel drive circuit 11 giving off a large amount of heat in operation is separately arranged on the chip different from the chip having the pixels 4. The effect of heat given off by the pixel drive circuit 11 on the pixels 4 is controlled. A change in image quality due to heat generation is thus minimized, and a high-quality image results. Since the pixel drive circuit 11 is arranged right beneath the pixels 4, the line conducting the drive pulse is shortened, and the wiring resistance along the line is decreased. The solid-state imaging device 1 thus operates not only with heat generation controlled but also at a low power consumption rating.

Figure 8:
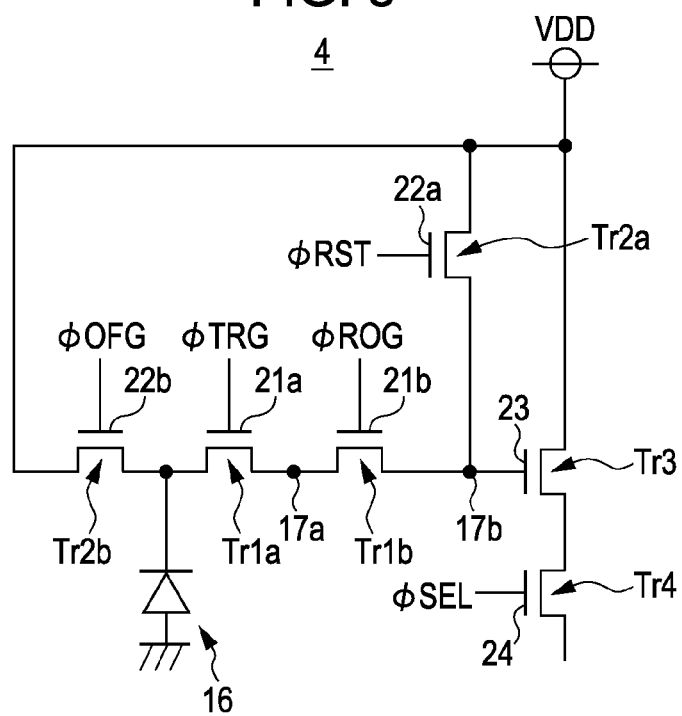
FIG. 8 is an equivalent circuit diagram of a pixel having a global shutter function.

Since the structure of the solid-state imaging device 1 of the first embodiment permits a high-speed operation with a delay and waveform distortion in the drive pulse of the pixel 4 controlled, the solid-state imaging device 1 finds appropriate applications as a solid-state imaging device having a global shutter function. FIG. 8 is an equivalent circuit diagram of an example of the pixel 4 having the global shutter function. The solid-state imaging device 1 of the first embodiment is implemented as a solid-state imaging device having the global shutter function.

In the solid-state imaging device having the global shutter function, the pixel 4 includes a charge storage capacitance 17a between the light sensing unit 16 and a floating diffusion region 17b as illustrated in FIG. 8. The charge storage capacitance 17a temporarily stores the signal charge. The pixel 4 also includes first transfer transistor Tr1a, second transfer transistor Tr1b, reset transistor Tr2a, amplifying transistor Tr3, selection transistor Tr4, and light-receiving reset transistor Tr2b.

The first transfer transistor Tr1a has the source thereof connected to the anode of the light sensing unit 16, and the drain thereof connected to the charge storage capacitance 17a temporarily storing the signal charge. The gate electrode 21a of the first transfer transistor Tr1a is supplied with the transfer pulse φTRG.

The second transfer transistor Tr1b has the source thereof connected to the charge storage capacitance 17a and the drain thereof connected to the floating diffusion region 17b. The gate electrode 21b of the second transfer transistor Tr1b is supplied with a reading pulse φROG.

The reset transistor Tr2a has the source thereof connected to the floating diffusion region 17b, and the drain thereof connected the power source voltage VDD. The gate electrode 22a of the reset transistor Tr2a is supplied with a reset pulse φRST.

The gate electrode 23 of the amplifying transistor Tr3 is electrically connected to the floating diffusion region 17b. The amplifying transistor Tr3 has the source thereof connected to the power source voltage VDD, and the drain thereof connected to the source of the selection transistor Tr4.

The selection transistor Tr4 has the source thereof connected to the drain of the amplifying transistor Tr3, and the drain thereof connected to the vertical signal line 13. The gate electrode 24 of the selection transistor Tr4 is supplied with a selection pulse φSEL.

The light-receiving reset transistor Tr2b has the source thereof connected to the anode of the light sensing unit 16, and the drain thereof connected to the power source voltage VDD. The gate electrode 22b of the light-receiving reset transistor Tr2b is supplied with a light-receiving reset pulse φOFG.

The solid-state imaging device having the global shutter function sets the light-receiving reset pulse φOFG to be on, thereby resetting the voltage at the light sensing units 16 of all the pixels 4 to a voltage close to the power source voltage VDD.

With the light-receiving reset pulse φOFG set to off, all the pixels 4 start concurrently an exposure operation on the light sensing units 16. When the transfer pulse φTRG is set to be on later, the exposure operation ends. The signal charge generated and stored at the light sensing unit 16 is transferred to the charge storage capacitance 17a.

Subsequently, with the reading pulse φROG turned on on a per pixel basis, the signal charge stored on the charge storage capacitance 17a is read onto the floating diffusion region 17b and then an amplified pixel signal is output to the vertical signal line 13 in the same manner as with the standard solid-state imaging device.

The solid-state imaging device having the global shutter function causes all the pixels to operate concurrently. In the solid-state imaging device 1 of the first embodiment, the distance between the pixel drive circuits 11 and the pixels 4 is substantially reduced by arranging the pixel drive circuits 11 right beneath the pixels 4. Since the delay and waveform distortion of the drive pulse are thus controlled, all the pixels can be driven concurrently at a high speed. The high speed operation is performed with all the pixels substantially concurrently driven, and the problem of pixel blurring is controlled.

In the solid-state imaging device 1 of the first embodiment, the first chip 2 and the second chip 3 are connected by the connection unit 12 including the micro bump 35. Alternatively, the connection unit 12 may be formed of a through via.

1.4 Modification of the First Embodiment

Figure 9:
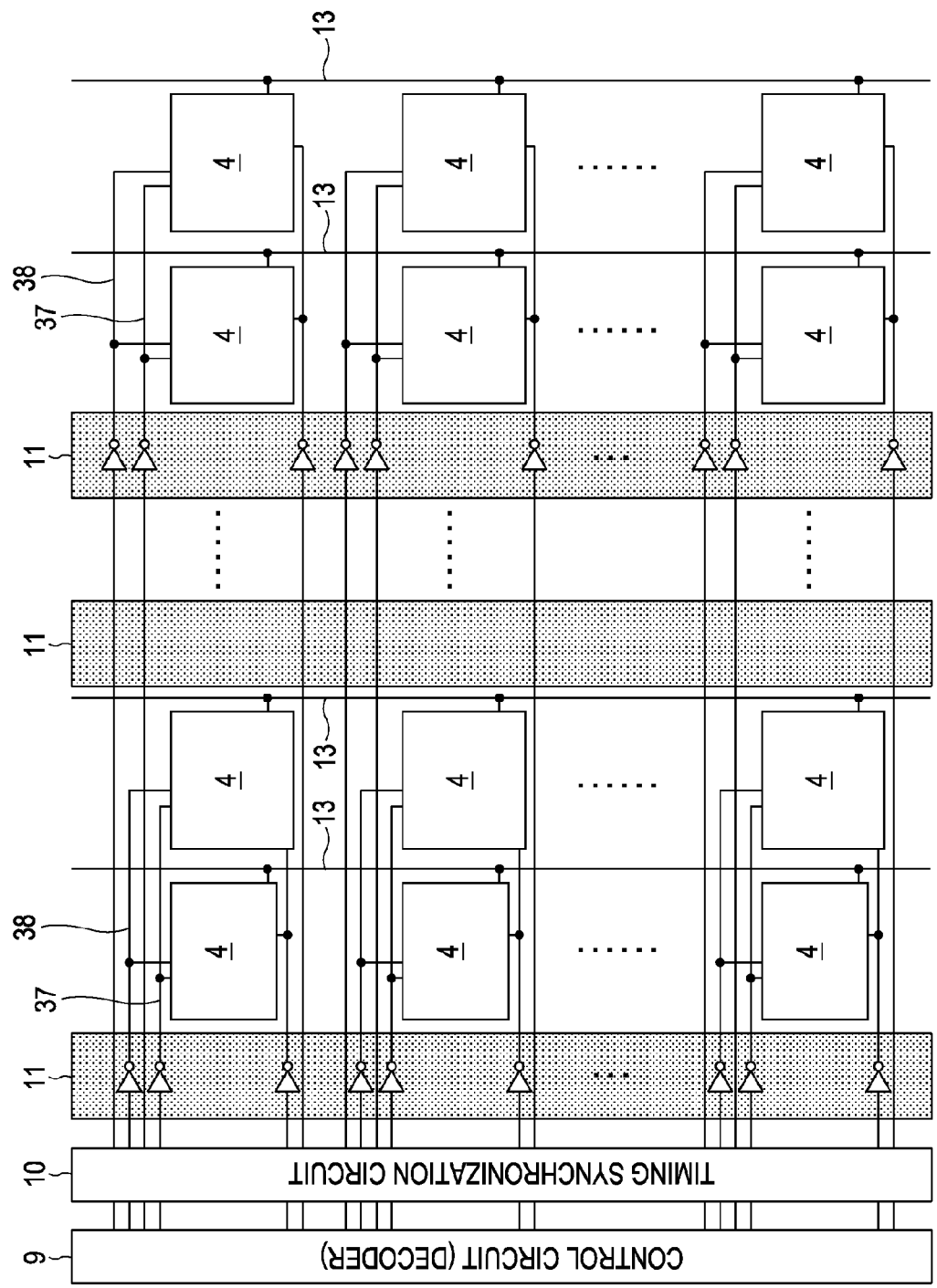
FIG. 9 is a block diagram illustrating an electrical connection of the pixel module in the solid-state imaging device in accordance with a modification of the first embodiment.

FIG. 9 is a block diagram illustrating an electrical connection of the pixel module 5 in the solid-state imaging device 1 in accordance with a modification of the first embodiment. In FIG. 9, elements identical to those illustrated in FIG. 6 are designated with the same reference numerals and the discussion thereof is omitted herein.

In the solid-state imaging device as the modification of the first embodiment, a plurality of pixel drive circuits 11 are arranged so that one pixel drive circuit 11 drives two columns of pixels 4. In the solid-state imaging device as the modification, the first chip 2 and the second chip 3 are laminated one on the other so that each pixel drive circuit 11 is right beneath two columns of pixels 4, although this arrangement is not illustrated.

In the solid-state imaging device of the modification, one pixel drive circuit 11 supplies the transfer pulses, the reset pulses, and the selection pulses respectively via the transfer lines 37, the reset lines 38, the selection lines 39 to the two columns of pixels 4.

The two columns of pixels 4 are supplied with the drive pulses from one pixel drive circuit 11 in this way. The distance between each pixel 4 and the corresponding pixel drive circuit 11 driving the pixel 4 is short, and the delay and waveform deformation of the drive pulses are thus controlled. The modification of the first embodiment provides the same advantages as those of the first embodiment.

In the modification illustrated in FIG. 9, the two columns of pixels 4 are connected to one pixel drive circuit 11. Alternatively, one pixel drive circuit 11 may be connected to two or more columns of pixels 4. In this case, the number of pixels 4 commonly connected to one pixel drive circuit 11 may be increased to the degree that neither delay nor waveform distortion takes place in the drive pulse supplied from the pixel drive circuit 11 to each pixel 4.

The pixels 4 driven by one pixel drive circuit 11 are divided into groups to reduce the number of pixel drive circuits 11. The circuit arrangement is thus simplified to the degree that the drive pulse driving the pixels 4 remains free from delay and waveform distortion.

2. Second Embodiment

Figure 10A:
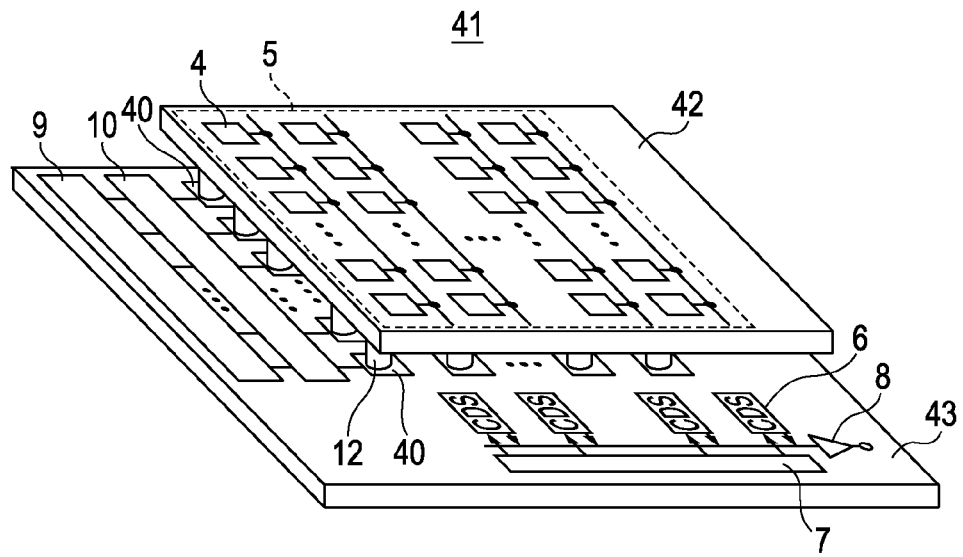
FIG. 10A is a perspective view diagrammatically illustrating a solid-state imaging device in accordance with a second embodiment of the present invention.
Figure 10B:
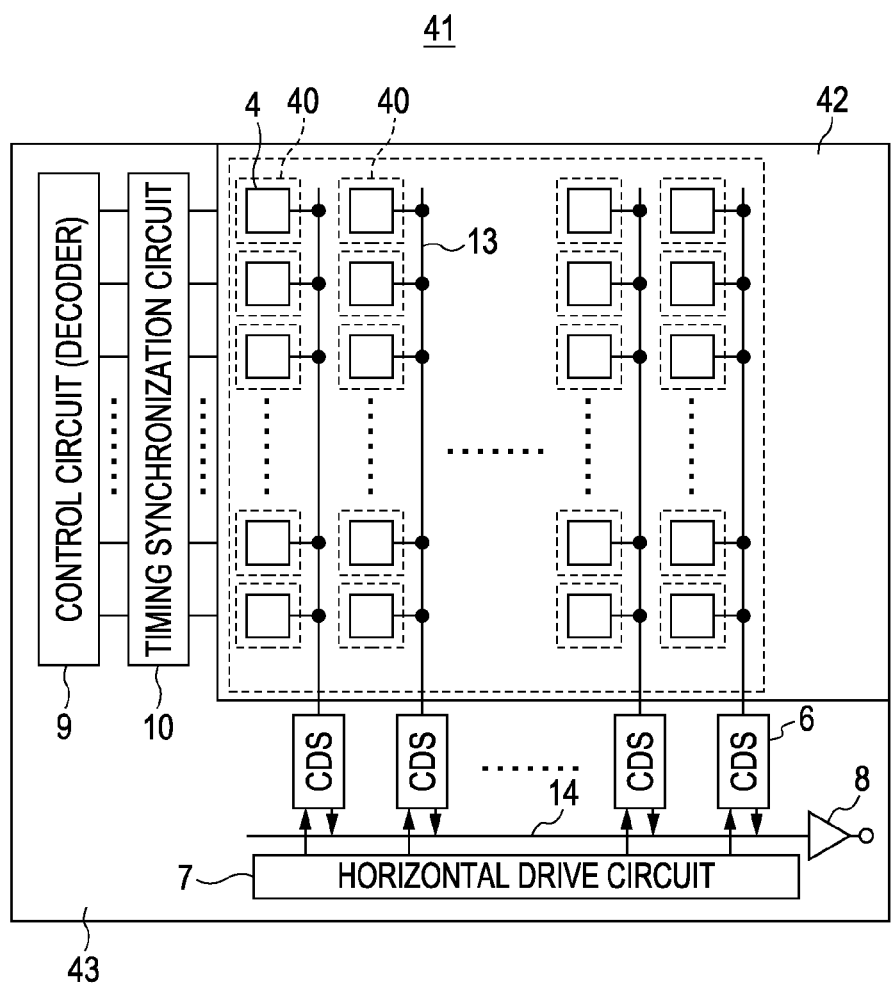
FIG. 10B is a top view diagrammatically illustrating the solid-state imaging device in accordance with the second embodiment.
Figure 11A:
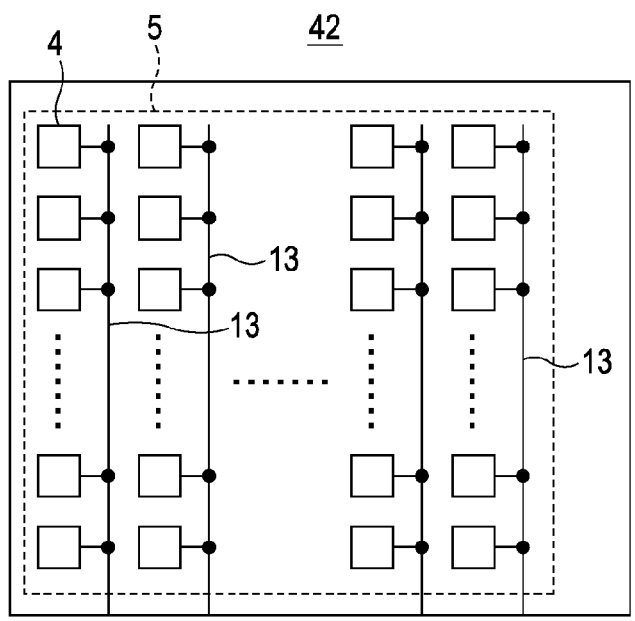
FIG. 11A is a block diagram diagrammatically illustrating a first chip.

A solid-state imaging device of a second embodiment of the present invention is described below. FIG. 10A is a perspective view diagrammatically illustrating a solid-state imaging device 41 in accordance with the second embodiment of the present invention, and FIG. 10B is a top view diagrammatically illustrating the solid-state imaging device 41 in accordance with the second embodiment. FIG. 11A is a block diagram diagrammatically illustrating a first chip 42, and FIG. 11B is a block diagram diagrammatically illustrating a second chip 43.

In FIGS. 10A and 10B, and 11A and 11B, elements identical those illustrated in FIGS. 3A and 3B and 4A and 4B are designated with the same reference numerals and the discussion thereof is omitted herein.

The second chip 43 of the second embodiment includes control circuit 9, timing synchronization circuit 10, and pixel drive circuit 40. The second chip 43 also includes the column signal processing circuit 6, the horizontal drive circuit 7, etc. at the final stage thereof. The first chip 42 includes the pixel module 5 only as illustrated in FIG. 11A.

Figure 11B:
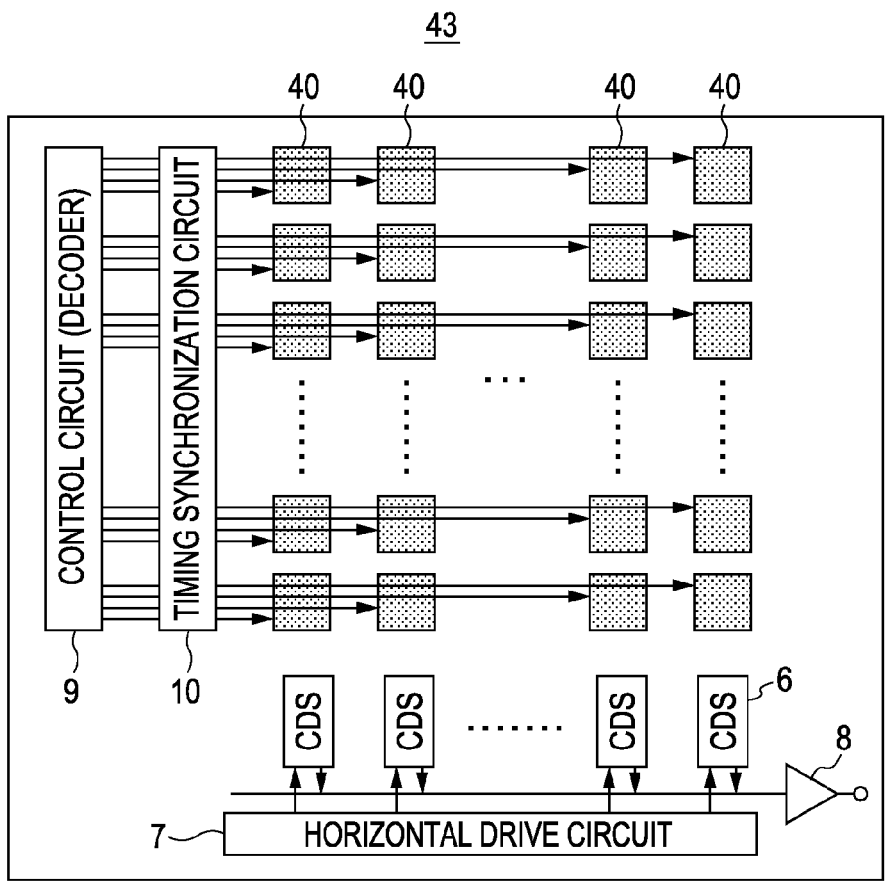
FIG. 11B is a block diagram diagrammatically illustrating a second chip.

Referring to FIG. 11B, the second chip 43 includes the plurality of pixel drive circuits 40 respectively corresponding to the pixels 4 on a one-to-one basis. In practice, the vertical signal lines 13 arranged on the first chip 42 are electrically connected to the column signal processing circuits 6 on the second chip 43.

Referring to FIGS. 10A and 10B, the first chip 42 and the second chip 43 are laminated to each other so that the pixel drive circuits 40 come respectively right beneath the pixels 4. The pixels 4 are respectively connected to the pixel drive circuits 40 via the connection unit 12.

Figure 12:
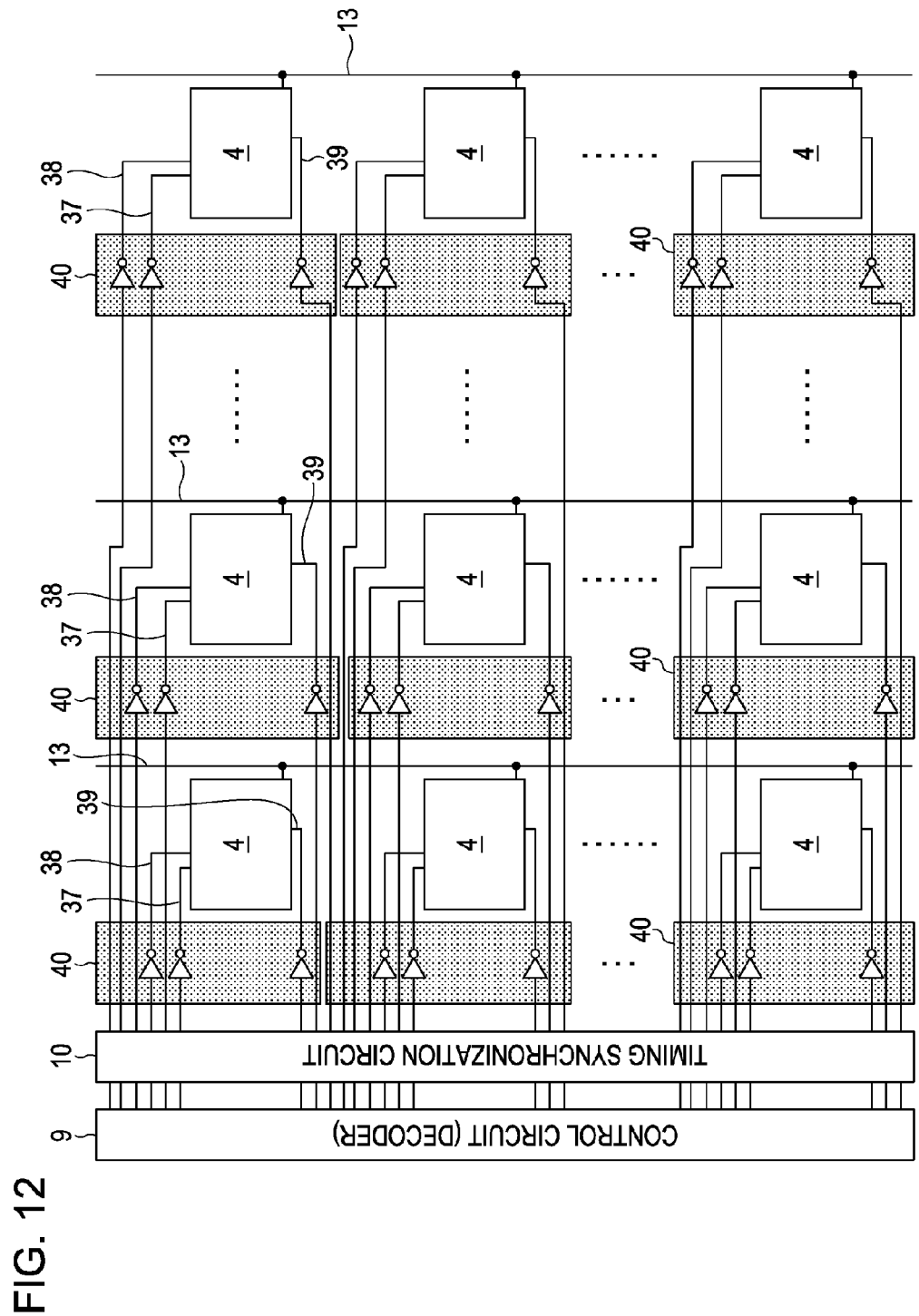
FIG. 12 is a block diagram illustrating an electrical connection of the pixel module of the solid-state imaging device in accordance with the second embodiment.

FIG. 12 is a block diagram illustrating an electrical connection of the pixel module 5 of the solid-state imaging device 41 in accordance with the second embodiment. In FIG. 12, elements identical to those illustrated in FIG. 6 are designated with the same reference numerals and the discussion thereof is omitted here.

Referring to FIG. 12, the solid-state imaging device 41 of the second embodiment includes the pixels 4 driven by the respective pixel drive circuits 40.

In the solid-state imaging device 41 of the second embodiment, the pixel drive circuit 40 is arranged right beneath the corresponding pixel 4. The distance between the pixel 4 and the pixel drive circuit 40 driving the pixel 4 is shortened. The pixel 4 is directly driven by the corresponding pixel drive circuit 40. The delay and waveform deformation of the drive pulse supplied from the pixel 4 are controlled and a high-speed driving operation is permitted.

The solid-state imaging device 41 of the second embodiment includes the second chip 43. The second chip 43 having the pixel drive circuits 40 also includes a final stage signal processing circuit (including the column signal processing circuit 6, the horizontal drive circuit 7, etc.). With this arrangement, the circuit giving off a large amount of heat is completely separated from the pixels 4. The effect of image degradation due to heat generation is minimized, and a high-quality image results.

In accordance with the second embodiment, one pixel drive circuit 40 drives one pixel 4. Alternatively, one pixel drive circuit 40 may drive a plurality of adjacent pixels 4. In this case, the number of pixels 4 commonly connected to one pixel drive circuit 41 may be increased to the degree that neither delay nor waveform distortion takes place in the drive pulse supplied from the pixel drive circuit 40 to each pixel 4.

The pixels 4 driven by one pixel drive circuit 40 are divided into groups to reduce the number of pixel drive circuits 40. The circuit arrangement is thus simplified to the degree that the drive pulse driving the pixels 4 remains free from delay and waveform distortion.

The second embodiment further provides the same advantages as those of the first embodiment.

3. Third Embodiment

Figure 13:
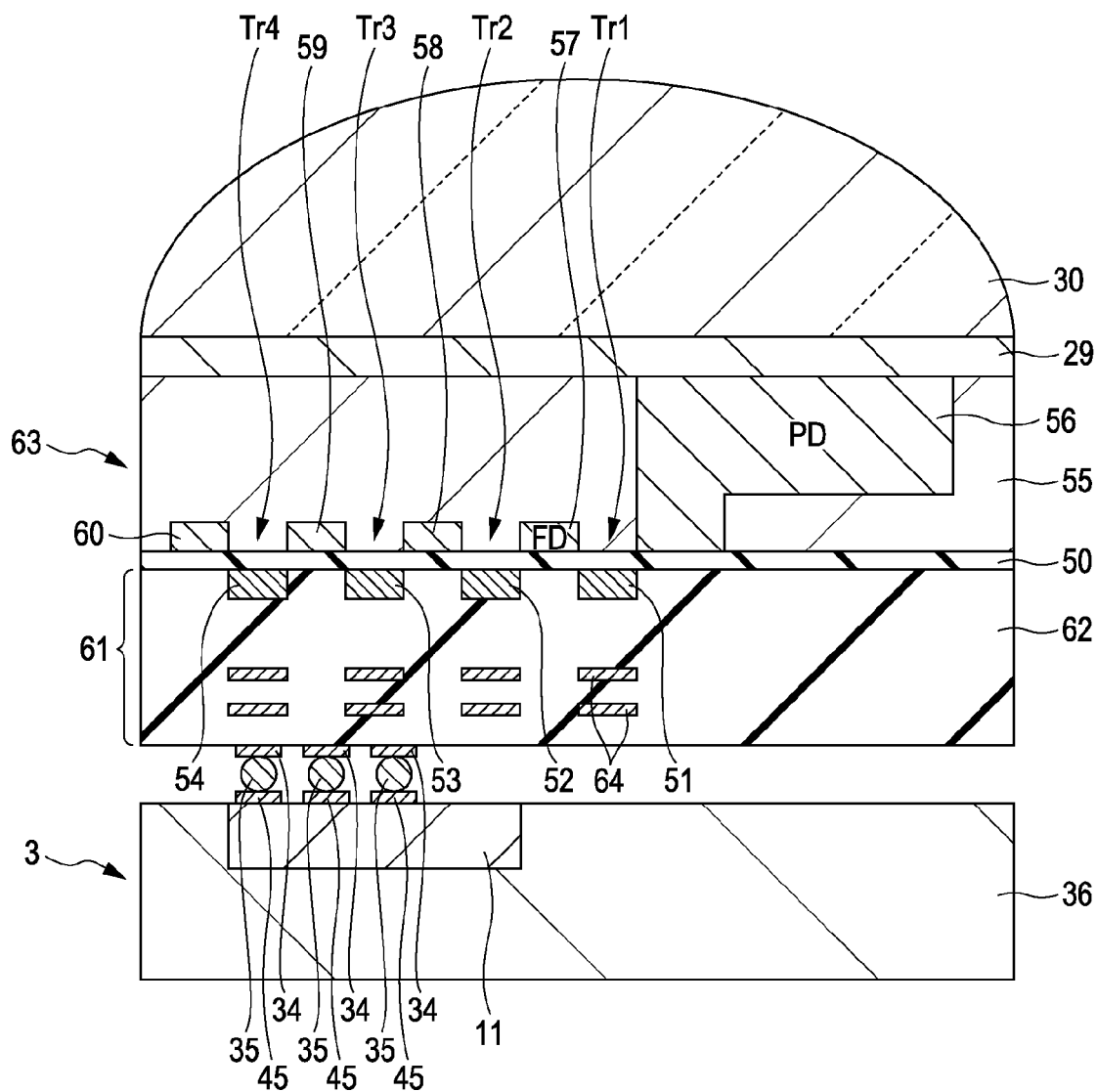
FIG. 13 is a sectional view diagrammatically illustrating a pixel formed on the first chip, a pixel drive circuit formed on the second chip, and a connection unit of the first and second chips in the solid-state imaging device of a third embodiment of the present invention.

A solid-state imaging device of a third embodiment of the present invention is described below. FIG. 13 is a sectional view diagrammatically illustrating a pixel, a pixel drive circuit, and a connection unit in the solid-state imaging device of the third embodiment of the present invention. The solid-state imaging device of the third embodiment remains unchanged in general structure from the solid-state imaging device 1 illustrated in FIGS. 3A and 3B, and the discussion thereof is omitted here. In FIG. 13, elements identical to those illustrated in FIG. 5 are designated with the same reference numerals and the discussion thereof is omitted here.

The solid-state imaging device of the third embodiment is of a top light incident type. A first chip 63 is different in structure to the counterpart in the first embodiment.

As illustrated in FIG. 13, the first chip 63 includes substrate 55 having the light sensing unit 56, a plurality of wiring layers 61, color filter layer 29, and on-chip microlens 30. The substrate 55 is formed of a semiconductor substrate made of silicon. The substrate 55 includes the light sensing unit 56 on a top side thereof serving as a light incident surface. The substrate 55 includes a light diffusion unit 57, and impurity regions 58, 59, and 60 forming sources and drains of predetermined MOS transistors.

The light sensing unit 56 includes a photodiode. The light diffusion unit 57 is formed of an impurity region formed in an area adjacent to the light sensing unit 56. The impurity regions 58, 59, and 60 are formed in predetermined areas in the bottom portion of the substrate 55.

The wiring layers 61 are formed on the bottom side of the substrate 55. The wiring layers 61 include gate electrodes 51, 52, 53, and 54 forming the predetermined MOS transistors with a gate insulator 50 on the bottom surface of the substrate 55. A gate electrode 51 formed below and between the light sensing unit 56 and the light diffusion unit 57 serves as the gate electrode of the transfer transistor Tr1. A gate electrode 52 formed below and between the light diffusion unit 57 and the impurity region 58 serves as the gate electrode of the reset transistor Tr2. A gate electrode 53 formed below and between the impurity region 58 and the impurity region 59 serves as the gate electrode of the amplifying transistor Tr3. A gate electrode 54 formed below and between the impurity region 59 and the impurity region 60 serves as the gate electrode of the selection transistor Tr4. The wiring layers 61 include a plurality of wiring layers 64 (two layers in the third embodiment) below the gate electrodes 51, 52, 53, and 54 with an interlayer insulator 62 interposed therebetween.

Lines respectively connected to the gate electrodes 51, 52, 53, and 54 of the transfer transistor Tr1, the reset transistor Tr2, and the selection transistor Tr4 are extended through micro pads 34 on the side of the wiring layers 61 opposite the substrate 55 forming the first chip 63. The color filter layer 29 is formed on the top side of the substrate 55 serving as a light incident side. The color filter layer 29 thus includes a red color filter, a green color filter, and a blue color filter on a per pixel basis.

The on-chip microlens 30 is formed on top of the color filter layer 29, and collects incident light efficiently to the light sensing unit 56.

In accordance with the third embodiment, the top side of the substrate 55, opposite the wiring layers 61 of the substrate 55 serves as a light incident side.

In the solid-state imaging device of the third embodiment, the micro pads 34 formed on the first chip 63 and the micro pads 45 formed on the second chip 3 are respectively connected via the micro bumps 35. The pixel drive circuit 11 formed on the second chip 3 is thus connected to the pixels on the first chip 63.

As in the first embodiment, one pixel drive circuit 11 is arranged for one column of pixels 4 in the third embodiment.

In the solid-state imaging device of the third embodiment, the side of the first chip 63 having the wiring layers 61 formed on the substrate 55 is an interface with the second chip 3, and the top side of the substrate 55 serves as a light incident side. The light incident side of the substrate 55 is mainly occupied by the light sensing unit 56, and the area of the light incident surface is increased. An amount of saturation charge is increased.

The wiring layers 61 of the first chip 63 are arranged to face the second chip 3. The pixel drive circuit 11 formed on the second chip 3 is easily connected to the pixels 4 on the first chip 63. More specifically, in accordance with the first embodiment, the contact members 31, 32, and 33 are arranged on the substrate 15 to connect the pixel drive circuit 11 to the pixels 4 as illustrated in FIG. 5. The third embodiment is free from such an arrangement. The number of process steps for connecting the first chip 63 to the second chip 3 is thus reduced.

The third embodiment provides the same advantages as those of the first embodiment.

The structure of the third embodiment is applicable to the second embodiment.

In accordance with the first through third embodiments, the present invention is implemented in the CMOS solid-state imaging device where unit pixels for detecting as a physical quantity a signal charge responsive to an amount of incident light are arranged in a matrix of rows and columns. The present invention is not limited to the CMOS solid-state imaging device. The present invention is not limited to a column-type solid-state imaging device in which a column circuit is arranged for a pixel column of pixels arranged in a two-dimensional matrix.

The present invention is applicable to a solid-state imaging device which detects the distribution of an amount of incident visible light and captures the distribution as an image. The present invention is also applicable to a solid-state imaging device which detects the distribution of an amount of incident infrared light, X rays, particles, or the like, and captures the distribution as an image. In a broad sense, the present invention is also applicable to a solid-state imaging device (physical quantity distribution detector), such as a fingerprint detection sensor which detects pressure, static capacitance, or other physical quantity, and captures the physical quantity as an image.

The present invention is not limited to a solid-state imaging device that scans unit pixels in a pixel module on a per row basis, and reads a pixel signal from each unit pixel. The present invention is also applicable to an X-Y addressing solid-state imaging device that selects any pixel on a per pixel unit basis and reads a signal from the selected pixel on a per pixel unit basis.

The solid-state imaging device may have a one-chip structure. Alternatively, the solid-state imaging device has a modular structure in which a pixel module, and a signal processor or an optical system are packaged together.

The present invention is not limited to the solid-state imaging device. The present invention is applicable to an imaging apparatus. The imaging apparatuses include a camera system, such as a digital still camera or a video camera, and an electronic apparatus such as a cellular phone having an imaging function. A modular structure arranged in the electronic apparatus, namely, a camera module may be also referred to as an imaging apparatus.

4. Fourth Embodiment

Figure 14:
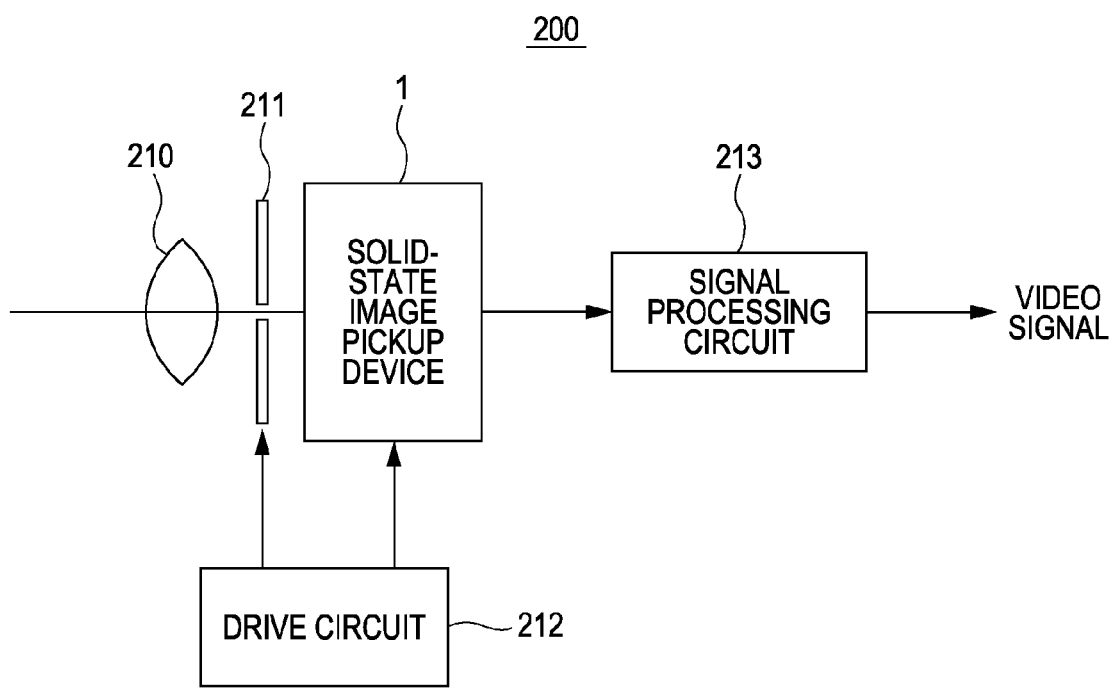
FIG. 14 is a block diagram illustrating an electronic apparatus in accordance with a fourth embodiment of the present invention.

An electronic apparatus of a fourth embodiment of the present invention is described below. FIG. 14 diagrammatically illustrates an electronic apparatus 200 of the fourth embodiment.

The electronic apparatus 200 of the fourth embodiment is an electronic apparatus (camera) including the solid-state imaging device 1 of the first embodiment.

The electronic apparatus 200 of the fourth embodiment includes solid-state imaging device 1, optical lens 210, shutter device 211, drive circuit 212, and signal processing circuit 213.

The optical lens 210 focuses an image bearing light beam (incident light beam) from a subject on an imaging surface of the solid-state imaging device 1. A signal charge responsive to the light beam is thus stored for a predetermined period of time on the solid-state imaging device 1.

The shutter device 211 controls a light application period and an exposure period to the solid-state imaging device 1.

The drive circuit 212 supplies a drive signal that controls a signal transfer operation of the solid-state imaging device 1 and a shutter operation of the shutter device 211. In response to the drive signal (timing signal) from the drive circuit 212, the solid-state imaging device 1 performs the signal transfer operation. The signal processing circuit 213 performs a variety of signal processing operations. A video signal processed by the signal processing circuit 213 is stored on a recording medium such as a memory, or output to a monitor.

Since the solid-state imaging device 1 performs a high-speed operation with concurrency maintained, the electronic apparatus 200 of the fourth embodiment reduces image blurring and improves image quality.

The electronic apparatus 200 incorporating the solid-state imaging device 1 is not limited to the camera. The electronic apparatus 200 is applicable to an imaging apparatus such as a digital still camera, or a camera module intended to be used in a mobile apparatus such as a cellular phone.

In accordance with the fourth embodiment, the solid-state imaging device 1 is applied to the electronic apparatus. Alternatively, the solid-state imaging device of each of the second and third embodiments may be applied to the electronic apparatus.

5. Fifth Embodiment

Figure 15:
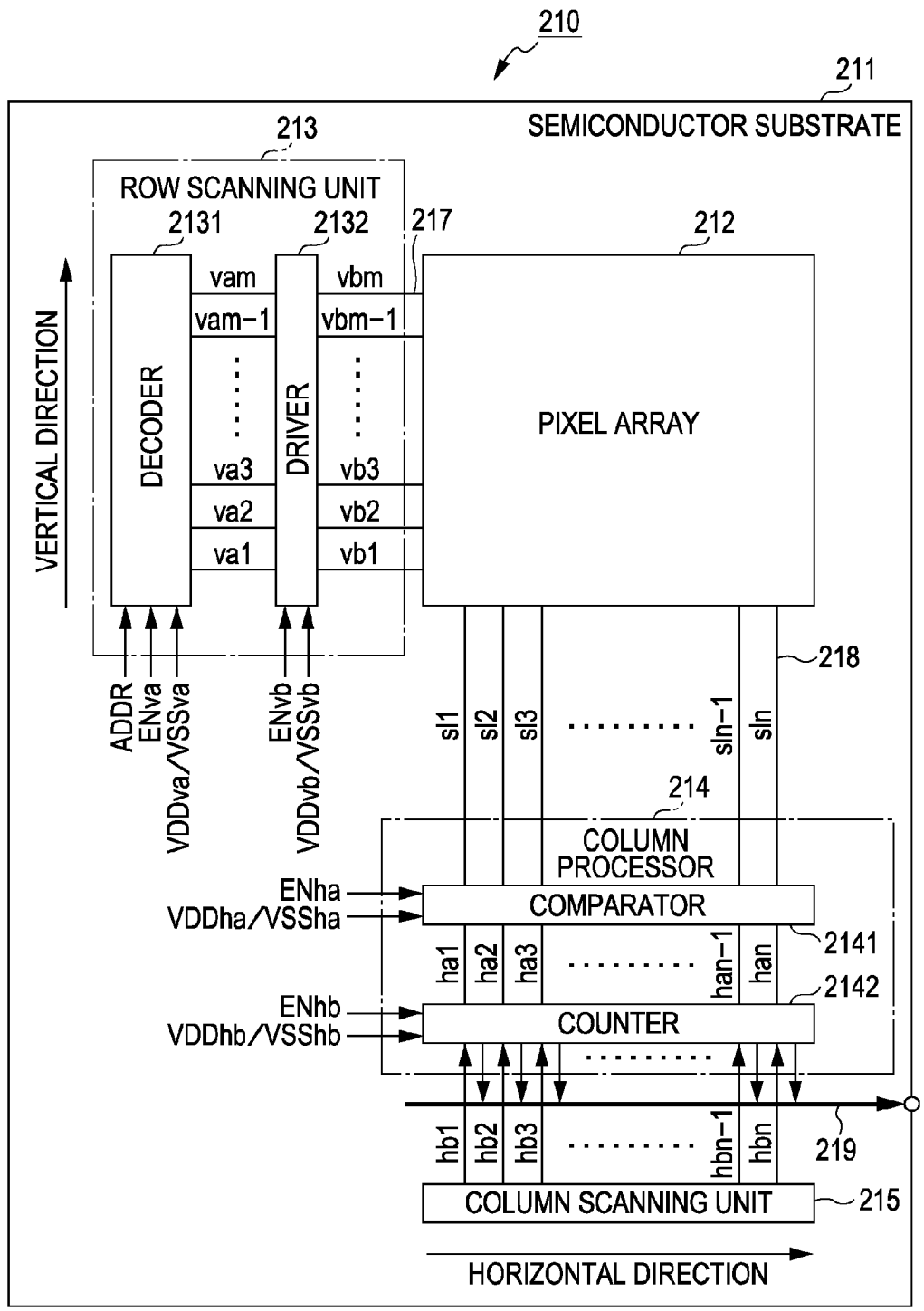
FIG. 15 illustrates a system configuration of a CMOS image sensor in accordance with a fifth embodiment of the present invention.

FIG. 15 illustrates a system configuration of a solid-state imaging device in accordance with a fifth embodiment of the present invention. The solid-state imaging device is a CMOS image sensor 210 such as an X-Y addressing solid-state imaging device. The CMOS image sensor 210 is an image sensor that has been produced through part or whole of a CMOS process.

The fifth embodiment may be implemented together with each of the first through fourth embodiments.

The CMOS image sensor 210 includes semiconductor substrate (chip) 211, pixel array 212, row scanning unit 213, column processor 214, column scanning unit 215, pixel drive lines 217, and vertical signal lines 218. Each unit pixel 220 includes photodiode 221, transfer transistor 222, reset transistor 223, amplifying transistor 224, selection transistor 225, and floating diffusion (FD) unit 226. The fifth embodiment is also related to solid-state imaging devices 230, 230A, 230B, 230C, and 230D. Solid-state imaging devices 230, 230A, 230B, 230C, and 230D include respectively cyclic layout pattern circuit 231, first chip 232, 232A, or 232B, adjustment circuit 233, second chip 234, connection unit 235, 235A, or 235B, variable delay circuits 2331-1 through 2331-*m*, and non-volatile memory 2332.

The CMOS image sensor 210 of the fifth embodiment includes a pixel array 212 formed on a semiconductor substrate (also referred to as a "chip") 211, and a peripheral circuit integrated on the same chip 211. In accordance with the fifth embodiment, the peripheral circuit includes the row scanning (vertical drive) unit 213, the column processor 214, and the column scanning (horizontal drive) unit 215.

The pixel array 212 includes a two-dimensional array of rows and columns of unit pixels (also referred to simply pixels). Each unit pixel includes a photoelectric converter generating a charge responsive to an amount of incident light and storing the charge therewithin. The unit pixel is described more in detail later.

The pixel array 212 further includes the pixel drive lines 217 arranged in a horizontal direction (in the direction of pixel column arrangement) on the array with each line 217 for a respective pixel row, and the vertical signal lines 218 in a vertical direction (in the direction of pixel row arrangement) on the array with each vertical signal line 218 for a respective pixel column. The pixel drive line 217 transfers a drive signal to read a signal from a pixel. Referring to FIG. 15, the pixel drive line 217 represents one line, but is not limited to one line. One end of the pixel drive line 217 is connected to an output line corresponding to each row of the row scanning unit 213.

The row scanning unit 213 is a pixel drive unit such as a shifter register or a decoder, and drives the pixels concurrently or on a per row basis in the pixel array 212. The row scanning unit 213 includes a decoder 2131 specifying any address, and a driver 2132 driving the floating diffusion unit 17 responsive to the address addressed by the decoder 2131.

The row scanning unit 213 addresses a row (va1-vam) to be driven in synchronization with an activation signal ENva. In response to the row addressing, the driver 2132 activates a pixel drive signal (vb1-vbm), thereby supplying the pixel drive signal to each pixel via the floating diffusion unit 17. The driver 2132 thus controls the pixels in a shutter operation, an exposure operation, a transfer operation, a reading operation, etc. Referring to FIG. 15, ENvb denotes the pixel drive signal of the driver 2132.

A specific internal structure of the row scanning unit 213 is not illustrated. The row scanning unit 213 includes typically two scanning systems, one being a reading scanning system and the other being a sweeping scanning system. The reading scanning system successively selects the unit pixels of the pixel array 212 on a per pixel row basis in order to read a signal from each unit pixel. The signal read from each unit pixel is an analog signal. The sweeping scanning system performs a sweeping operation on the pixel row, on which the reading scanning system is to perform the reading operation, in advance of the reading operation ahead of time in view of a shutter speed.

The sweeping operation of the sweeping scanning system sweeps unwanted charge from photoelectrical converters of the unit pixels on the reading row, thereby resetting the photoelectrical converters. Through the sweeping (resetting) of the unwanted charge with the sweeping scanning system, an electronic shutter operation is performed. The electronic shutter operation refers to an operation of discharging the charge in the photoelectric converter, and starting newly an exposure operation (storing optical charge).

The signal read through the reading operation of the reading scanning system is responsive to an amount of light subsequent to an immediately preceding reading operation or an immediately preceding electronic shutter operation. The storage period (exposure period) of the optical charge in the unit pixel is from the reading timing of the immediately preceding reading operation or the sweeping timing of the electronic shutter operation to the reading timing of the reading operation.

The signal output from the unit pixel of the pixel row selected and scanned by the row scanning unit 213 is supplied to the column processor 214 via the vertical signal lines 218. The column processor 214 performs a predetermined signal processing operation on a signal output from each pixel on the selected row via the vertical signal line 218 on a per pixel column basis of the pixel array 212. The column processor 214 also stores temporarily the pixel signal subsequent to the signal processing operation.

More specifically, the column processor 214 performs on the signal from the unit pixel a noise removal operation through a correlated double sampling (CDS) process, a signal amplification operation, and an analog-to-digital conversion operation. Through the noise removal operation, the signal is free from reset noise, or fixed pattern noise unique to the pixel, such as a fluctuation in the threshold value of an amplifying transistor.

To analog-to-digital convert the signal, the column processor 214 includes a comparator 2141 and counter 2142. In response to an activation signal ENha, the comparator 2141 in the column processor 214 compares analog signals (s11-s1$n$) received via the vertical signal lines 218 with a reference voltage that linearly varies at a slope waveform.

In response to an activation signal ENhb, the counter 2142 starts a counting operation in synchronization with a clock signal having a predetermined period. If the analog signals (s11-s1$n$) intersect the reference voltage causing the output of the comparator 2141 to be inverted, the counter 2142 stops the counting operation. The final count of the counter 2142 becomes a digital signal responsive to the size of the analog pixel signal.

The column scanning unit 215, including a shift register or a decoder, selects the unit pixels corresponding a pixel column of the column processor 214. Through the selection and scanning operation by the column scanning unit 215, the pixel signals processed by the column processor 214 are successively output to a horizontal bus 219. The pixel signal is then sent to outside of the shutter device 211 via the horizontal bus 219.

Circuit Structure of Unit Pixel

Figure 16:
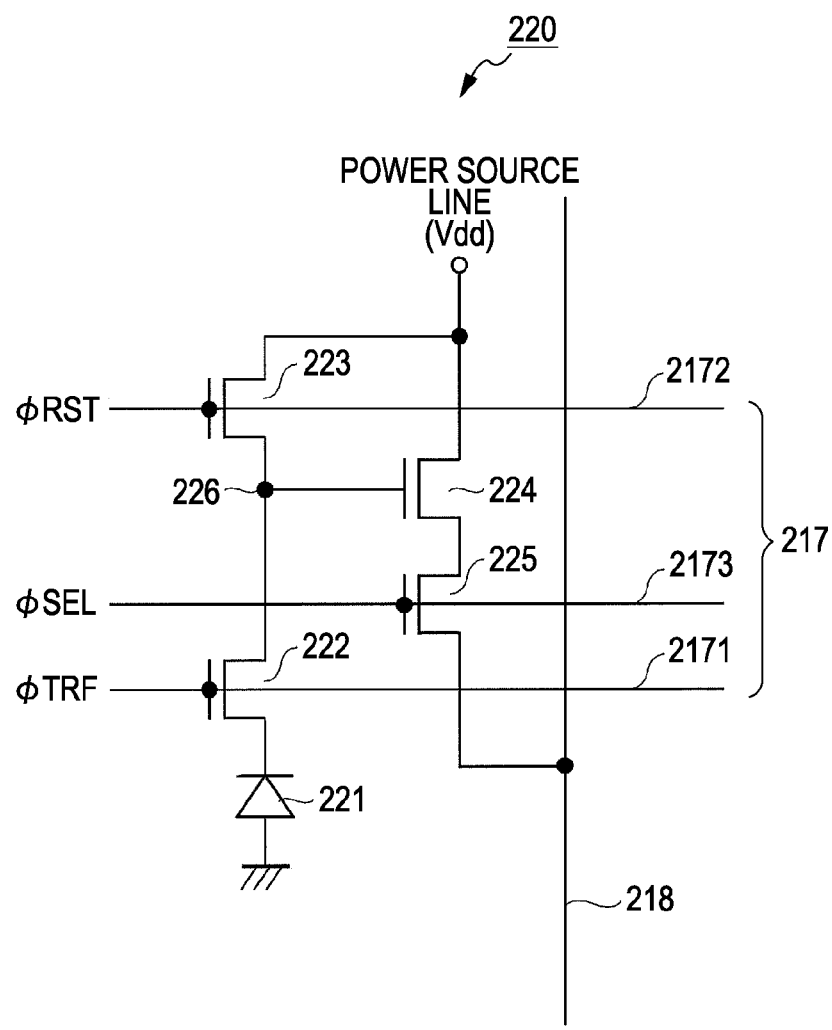
FIG. 16 is a circuit diagram of a unit circuit of the fifth embodiment.

FIG. 16 is a circuit diagram of the unit pixel 220 of the fifth embodiment. The unit pixel 220 of the fifth embodiment includes, in addition to a photodiode 221 as a photoelectric converter, four transistors, namely, transfer transistor 222, reset transistor 223, amplifying transistor 224, and selection transistor 225.

The transistors 222-225 are formed of N-channel MOS transistors. A semiconductor type of a combination of the transfer transistor 222, the reset transistor 223, the amplifying transistor 224, and the selection transistor 225 is not limited to the N-type.

The pixel drive lines 217, including a transfer line 2171, a reset line 2172, and a selection line 2173, are commonly connected to the unit pixels 220 on the same pixel row. The transfer line 2171, the reset line 2172, and the selection line 2173 are connected to respective output lines of the row scanning unit 213 on a per pixel row basis.

The photodiode 221 has the anode electrode connected to a negative side of a power source (for example, ground), and photoelectrically converts an optical charge responsive to an amount of received light. The photodiode 221 has the cathode electrode electrically connected to the gate electrode of the amplifying transistor 224 via the transfer transistor 222. A node 226 electrically connected to the gate electrode of the amplifying transistor 224 is referred to as a floating diffusion (FD) unit.

The transfer transistor 222 is connected between the cathode electrode of the photodiode 221 and the FD unit 226. The transfer transistor 222 receives at the gate electrode thereof a transfer pulse φTRF via the transfer line 2171. The transfer pulse φTRF has a high active level as high as the Vdd level. In response to the transfer pulse φTRF, the transfer transistor 222 is turned on, thereby transferring the optical charge photoelectrically converted by the photodiode 221 to the FD unit 226.

The reset transistor 223 has the drain electrode thereof connected to the pixel power source Vdd, and the source electrode thereof connected to the FD unit 226. The reset transistor 223 receives at the gate electrode thereof a reset pulse φRST of high active level via the reset line 2172 prior to the transfer of the signal charge from the photodiode 221 to the FD unit 226. In response to the reset pulse φRST, the reset transistor 223 is turned on, and discharges the charge at the FD unit 226 to the pixel power source Vdd, thereby resetting the FD unit 226.

The amplifying transistor 224 has the gate electrode thereof connected to the FD unit 226 and the drain electrode thereof connected to the pixel power source Vdd. The amplifying transistor 224 outputs the voltage at the FD unit 226 reset by the reset transistor 223 as a reset signal (at a reset level). The amplifying transistor 224 further outputs the voltage at the FD unit 226, to which the transfer transistor 222 has transferred the signal charge, as an optical storage signal (signal level).

The selection transistor 225 has the drain electrode thereof connected to the source electrode of the amplifying transistor 224, and the source electrode thereof connected to the vertical signal line 218. The selection transistor 225 receives at the gate electrode thereof a active-high selection pulse φSEL via the selection line 2173. In response to the selection pulse φSEL, the selection transistor 225 is turned on, and sets the unit pixel 220 in a selected state. The selection transistor 225 thus outputs the signal from the amplifying transistor 224 to the vertical signal line 218.

The transfer pulse φTRF, the reset pulse φRST, and the selection pulse φSEL are pixel drive signals vb1-vbm output from the previously described driver 2132 via the pixel drive lines 217. Optionally, the selection transistor 225 may be connected between the pixel power source Vdd and the drain of the amplifying transistor 224.

The unit pixel 220 is not limited to a pixel structure having the four transistors described above. For example, the unit pixel 220 may be composed of three transistors with the amplifying transistor 224 also serving as the selection transistor 225. The structure of the pixel circuit is not important.

Cyclic Layout Pattern Circuit

In the CMOS image sensor 210, the row scanning unit 213 forms a cyclic layout pattern circuit in a vertical direction. The decoder 2131 and the driver 2132 are unit circuits that cyclically vertically repeated. The column processor 214 and the column scanning unit 215 are cyclic layout pattern circuits cyclically horizontally repeated. The comparator 2141, the counter 2142, and unit circuits of the column scanning unit 215 for each pixel column are unit circuits cyclically horizontally repeated. The cyclic layout pattern circuits may also include a constant current source connected to one end of the vertical signal line 218 on a per pixel column.

Figure 17:
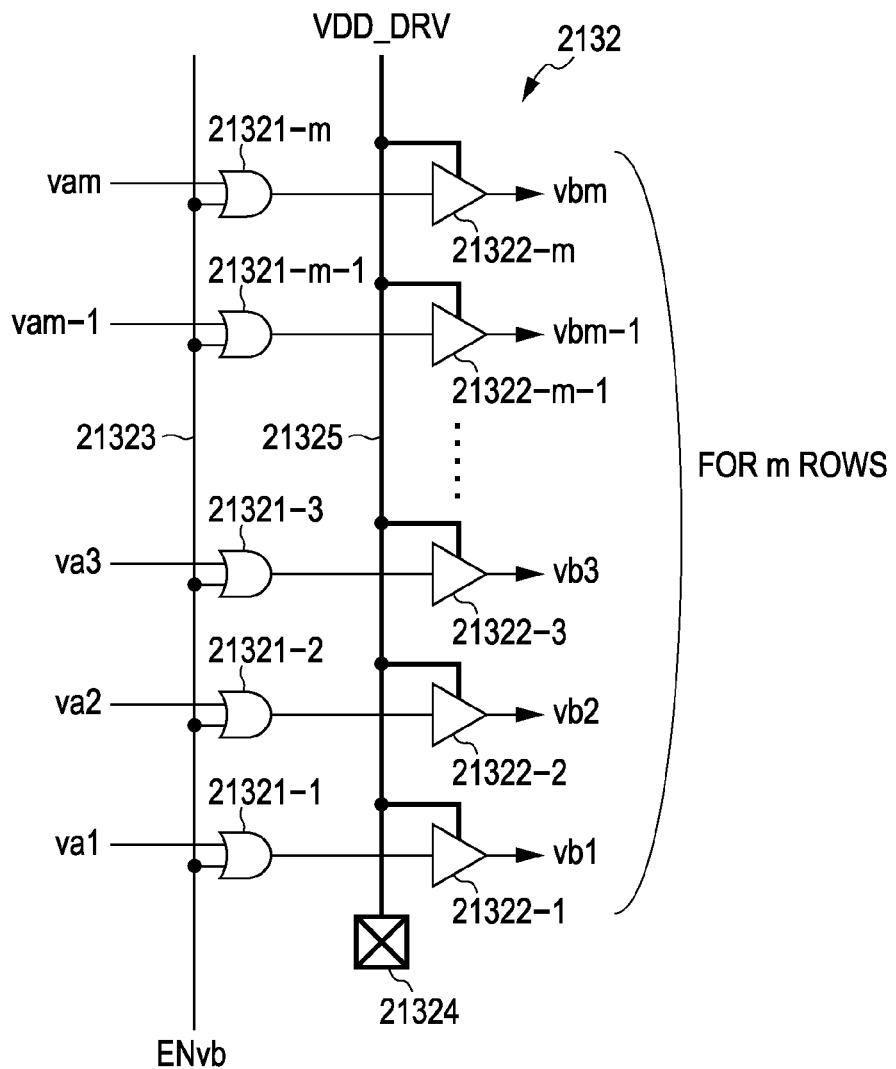
FIG. 17 is a block diagram illustrating a circuit structure of a driver of a scanning unit in accordance with the fifth embodiment.

The driver 2132 in the row scanning unit 213 are described below as an example of the cyclic layout pattern circuit with reference to FIG. 17. FIG. 17 is a block diagram illustrating a circuit structure of the driver 2132 of the row scanning unit 213.

Referring to FIG. 17, the driver 2132 includes m OR gates 21321-1 through 21321-$m$ and buffers 21322-1 through 21322-$m$ for m rows of the pixel array 212. The OR gates 21321-1 through 21321-$m$ receive row addressing signals va1-vam supplied from the decoder 2131 and all pixel drive signal ENvb commonly supplied via a transfer line 21323. The buffers 21322-1 through 21322-$m$ receive a power source voltage via a power pad 21324 and a power source line 21325. In response to the outputs from the OR gates 21321-1 through 21321-$m$, the buffers 21322-1 through 21322-$m$ output pixel drive signals vb1-vbm.

The driver 2132 as one example of cyclic layout pattern circuit includes the OR gates 21321-1 through 21321-$m$ and the buffers 21322-1 through 21322-$m$ arranged in a vertical direction (in a direction along which the pixel rows are arranged).

Delay in Signal Activation and Deactivation Timings

Figure 18:
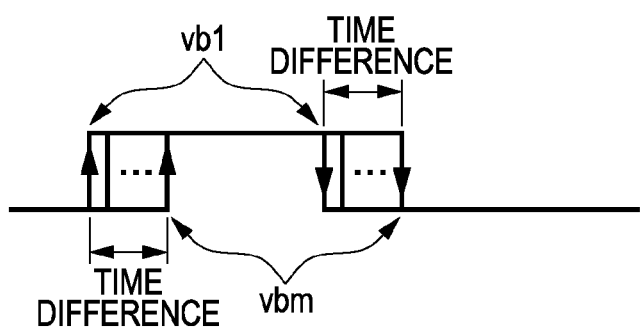
FIG. 18 is a waveform diagram illustrating how a difference in an activation and deactivation timings of a pixel drive signal occurs in response to a difference in a delay time and a difference in an IR drop.

A delay occurs in the driver 2132 depending on a difference in a parasitic resistance and a parasitic capacitance responsive to the line length of the transfer line 21323 sending the all pixel drive signal ENvb. A difference occurs in the magnitude of the IR drop depending on the distance from the power source pad 21324. Referring to FIG. 18, these differences cause a difference in the vertical position (row position) in the activation and deactivation timings of the pixel drive signals vb1-vbm.

The activation and deactivation timings refer to rising and falling timings, i.e., transition timings if the pixel drive signals vb1-vbm have the positive logic (active high). A difference in the activation and deactivation timings becomes a difference in timing of driving the pixel 220, thereby leading to shading in the vertical direction and lack of concurrency.

6. Features of the Fifth Embodiment

A system in package (SIP) design has difficulty in performing a multi-point tuning correction operation. In contrast, the fifth embodiment of the present invention performs a multi-point tuning correction operation related to the difference in the activation and deactivation timings of the signal of the cyclic layout pattern circuit. The multi-point tuning correction operation is performed on a per row basis, on a column basis, on a row group basis, or on a column group basis on the pixel array 212. The multi-point tuning correction feature is implemented in a manner free from a manufacturing process difficulty such as a difficulty to achieve a high withstand voltage rating characteristic of the SOC structure.

Figure 19:
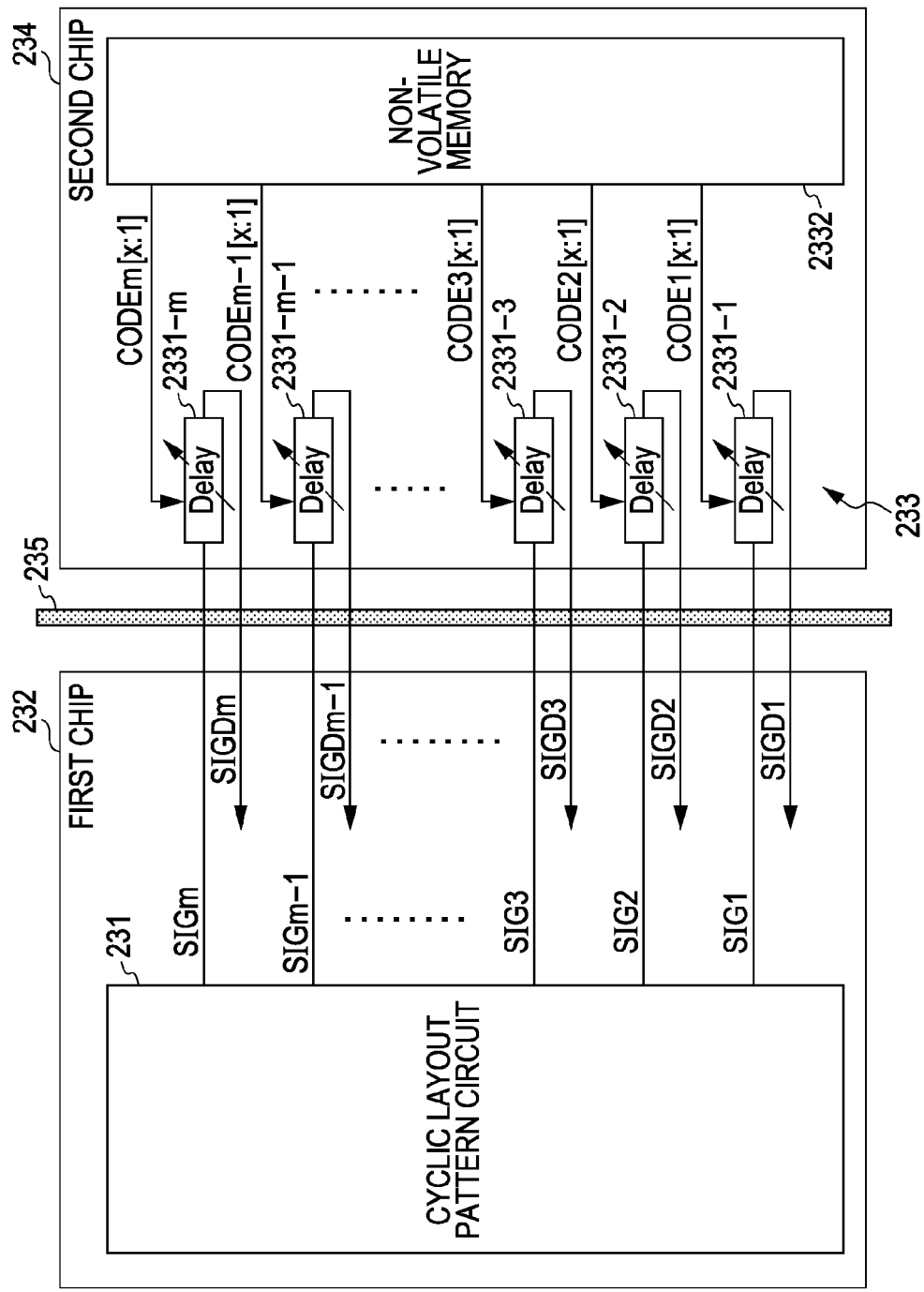
FIG. 19 is a system diagram diagrammatically illustrating the solid-state imaging device in accordance with the fifth embodiment.

FIG. 19 is a system diagram diagrammatically illustrating the solid-state imaging device in accordance with the fifth embodiment.

Referring to FIG. 19, the cyclic layout pattern circuit 231 is formed on the first chip 232. The cyclic layout pattern circuit 231 refers to a unit circuit that is cyclically repeated in a regular pattern in at least one of a vertical direction along which the pixel rows are arranged on the pixel array 212 and a horizontal direction along which the pixel columns are arranged on the pixel array 212.

In the CMOS image sensor 210 of FIG. 15, the row scanning unit 213 is one example of the cyclic layout pattern circuit 231 in which the unit circuits are cyclically repeated vertically in a regular pattern. The column processor 214, the column scanning unit 215, and the constant current source connected to one end of the vertical signal line 218 for each pixel column are examples of the cyclic layout pattern circuit 231 in which the unit is cyclically repeated horizontally in a regular pattern.

The row scanning unit 213 illustrated in FIG. 17 is discussed below as one example of the cyclic layout pattern circuit 231. The unit circuit includes an OR gate 21321 (21321-1 through 21321-*m*) and a buffer 21322 (21322-1 through 21322-*m*). The unit circuit composed of the OR gate 21321 and the buffer 21322 is cyclically repeated in a regular pattern by the number of rows.

If the cyclic layout pattern circuit 231 is the row scanning unit 213, the pixel drive signals vb1-vbm are signals SIG1-SIGm of the cyclic layout pattern circuit 231. If the cyclic layout pattern circuit 231 is the column processor 214, the activation signals ENha and ENhb respectively supplied to the comparator 2141 and the counter 2142 on a per pixel column basis are the signals SIG1-SIGm of the cyclic layout pattern circuit 231.

The adjustment circuit 233 for the tuning correction operation is formed the second chip 234. The adjustment circuit 233 tuning corrects a difference in the activation and deactivation timings of the signals SIG1-SIGm caused by a difference in the parasitic resistance and the parasitic capacitance along the wiring length and caused by a difference in the IR drop depending on the distance from the power source. The adjustment circuit 233 thus adjusts the timings of the signal for concurrency.

The adjustment circuit 233 includes variable delay circuits 2331-1 through 2331-*m* as a plurality of unit circuits corresponding to the unit circuits of the cyclic layout pattern circuit 231, and a non-volatile memory 2332 as a storage element.

The variable delay circuits 2331-1 through 2331-*m* are designed so that an amount of delay thereof is adjusted by controlling resistance, capacitance, the number of stages of transistors, and current flowing. The variable delay circuits 2331-1 through 2331-*m* can adjust the activation and deactivation timings of the signal of the cyclic layout pattern circuit 231 with a fineness of x bits. Here, x represents an adjustment value for the variable delay circuits 2331-1 through 2331-*m*.

The non-volatile memory 2332 stores m*x codes CODE1 [x:1] through CODEm[X:1] for setting delay quantities for the variable delay circuits 2331-1 through 2331-*m*.

The codes CODE1[x:1] through CODEm[X:1] are values predicted through simulation, and are delay quantities different depending on a position in a vertical direction and a horizontal direction. The delay quantities are pre-stored on the non-volatile memory 2332 as information for adjusting (correcting) the activation and deactivation timings of the signals SIG1 through SIGm related to the cyclic layout pattern circuit 231.

The second chip 234 having the adjustment circuit 233 is laminated on the first chip 232 having the cyclic layout pattern circuit 231. In the lamination process, whether the first chip 232 is on top of the second chip 234 or vice versa is determined by an incident light receiving structure (irradiation structure) with respect to the pixel 220 if the pixel array 212 is formed on the first chip 232.

More specifically, with a surface of a substrate having a wiring layer for the photoelectric converter (photodiode 221) serving as the top side, the pixel structure is a top side light incident type (top irradiation structure) letting incident light in from the top side. In such a structure, the second chip 234 is laminated beneath the first chip 232. In a pixel structure of a bottom side light incident type (bottom irradiation structure) letting incident light in from the bottom side, opposite the wiring layer of the substrate, the first chip 232 is laminated beneath the second chip 234.

The unit circuits of the cyclic layout pattern circuit 231 on the first chip 232, are electrically connected to the unit circuits of the adjustment circuit 233 on the second chip 234, namely, the variable delay circuits 2331-1 through 2331-*m*, in a mapped state via a connection unit 235. The connection unit 235 includes two line systems with one line system for transferring a signal from the first chip 232 to the second chip 234 and the other line system for transferring a signal from the second chip 234 to the first chip 232.

The connection unit 235 electrically connects the unit circuits of the cyclic layout pattern circuit 231 to the variable delay circuits 2331-1 through 2331-*m* through a three-dimensional connection technique such as the through silicon via (TSV) of the related art. The three-dimensional connection techniques also include a connection technique using a micro bump in addition to the TSV technique. Three-dimensionally connected points at the connection unit 235 are where the unit circuits of the cyclic layout pattern circuit 231 are respectively connected to the rows or the columns of pixels, or groups of rows or groups of columns of pixels.

Tuning Correction Operation

The cyclic layout pattern circuit 231 on the first chip 232 in the solid-state imaging device 230 of the fifth embodiment is, to some degree, subject to a difference in the parasitic resistance and the parasitic capacitance depending on the length of the wiring line in the cyclic layout pattern circuit 231 and a difference in the IR drop depending on the distance from the power source. These differences cause a delay in the activation and deactivation timings of the signals SIG1-SIGm of the cyclic layout pattern circuit 231 in the vertical direction and the horizontal direction.

The signals SIG1-SIGm output from the unit circuits of the cyclic layout pattern circuit 231 are supplied to the respective variable delay circuits 2331-1 through 2331-m on the second chip 234 via the connection unit 235. The variable delay circuits 2331-1 through 2331-m respectively timing adjust the signals SIG1-SIGm in response to the delay quantities responsive to the codes CODE1[x:1] through CODEm[X:1] stored on the non-volatile memory 2332. Through the timing adjustment operation, the activation and deactivation timings of the signals SIG1-SIGm are synchronized with each other (set to be concurrent with each other).

Signals SIGD1-SIGDm timing adjusted by the variable delay circuits 2331-1 through 2331-m are supplied back to the first chip 232 via the connection unit 235. In accordance with the fifth embodiment, the signals SIGD1-SIGDm become the pixel drive signals vb1-vbm for driving the unit pixels 220 of the pixel array 212 (see FIG. 15).

The finally obtained signals SIGD1-SIGDm for the unit circuits of the cyclic layout pattern circuit 231, i.e., pixel drive signals vbD1-vbDm are free from delay.

The cyclic layout pattern circuit 231 is thus arranged on the first chip 232, the adjustment circuit 233 is arranged on the second chip 234, and the first chip 232 and the adjustment circuit 233 are electrically connected through the connection unit 235 as a three-dimensional connection. This arrangement is free from a limitation to the number of pins, such as external terminals at which the cyclic layout pattern circuit 231 and the adjustment circuit 233 are connected. The multi-point tuning correction operation can thus be performed for the number of rows or columns of pixels on the pixel array 212, or the number of groups of rows or columns of pixels on the pixel array 212.

The cyclic layout pattern circuit 231 operating at a drive voltage as low as 3 to 5 V and the adjustment circuit 233 including the non-volatile memory 2332 operating at a voltage as high as 10 to 20 V are arranged on separate chips. The manufacturing process of the solid-state imaging device is thus free from the manufacturing process characteristic of the SOC structure.

Solid-state imaging devices (such as a CMOS image sensor) of the fifth embodiments having the above-described basic structure are specifically described below.

6.1 First Modification of the Fifth Embodiment

Figure 20:
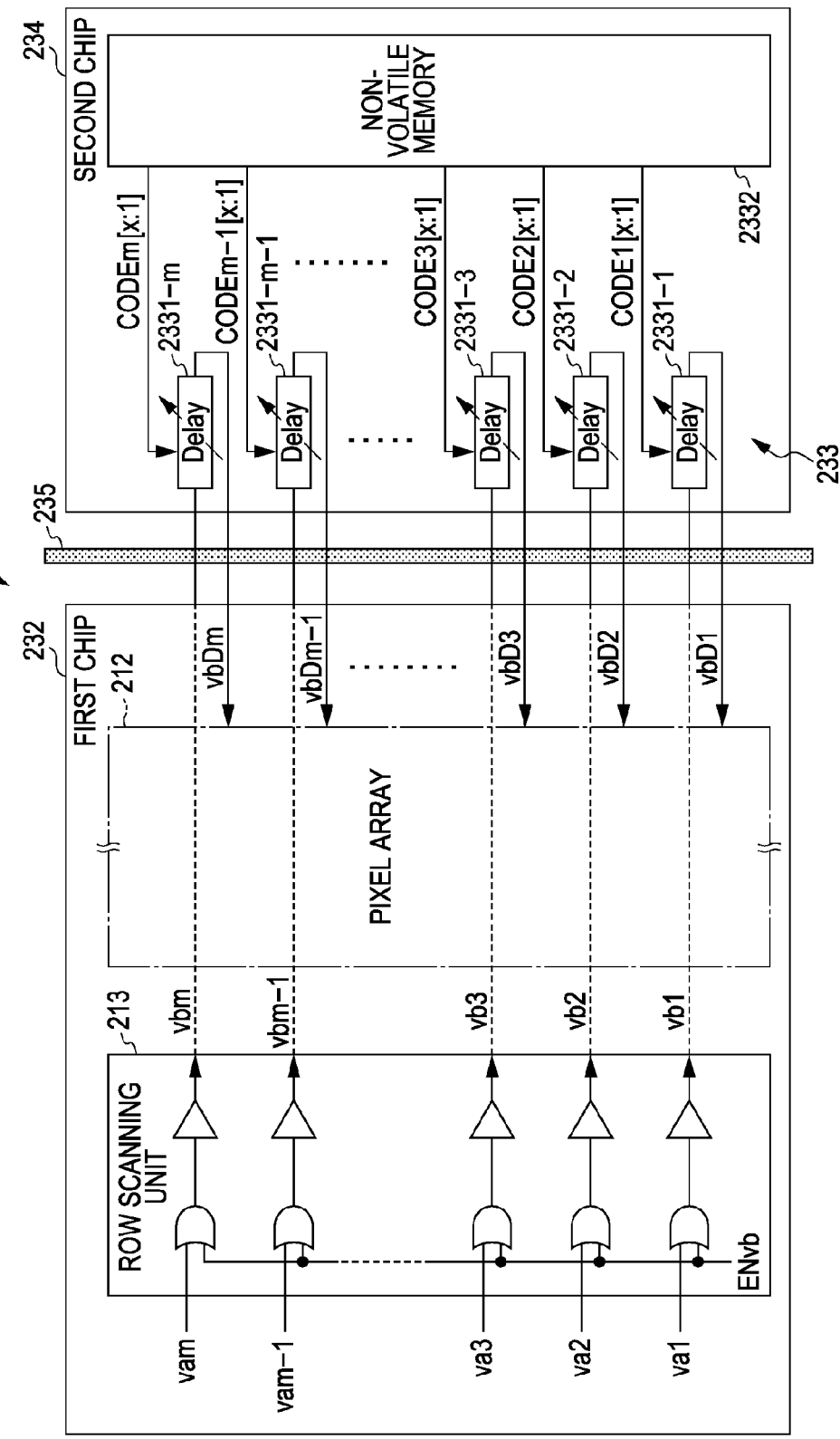
FIG. 20 is a system diagram of a solid-state imaging device in accordance with a first modification of the fifth modification.

FIG. 20 is a system diagram of a solid-state imaging device 230A in accordance with a first modification of the fifth modification. Referring to FIG. 20, elements identical to those described in FIGS. 15 and 19 are designated with the same reference numerals and the discussion thereof is omitted here.

The solid-state imaging device 230A of the first modification of the fifth embodiment includes the row scanning unit 213 as the cyclic layout pattern circuit 231. As the CMOS image sensor 210 illustrated in FIG. 15, the row scanning unit 213 is arranged on the same substrate as that having the pixel array 212, i.e., on the first chip 232. The second chip 234 corresponds to the semiconductor substrate illustrated in FIG. 15.

The row scanning unit 213, configured as illustrated in FIG. 17, outputs the pixel drive signals vb1-vbm driving the unit pixels 220 on the pixel array 212. The pixel drive signals vb1-vbm are supplied to the variable delay circuits 2331-1 through 2331-m on the adjustment circuit 233 via the connection unit 235 as the three-dimensional connection that electrically connects the first chip 232 to the second chip 234.

The solid-state imaging device 230A performs concurrently the shutter operation on all the pixels, i.e., has the global shutter function for starting an exposure operation on all the pixels, and then ending the exposure operation on all the pixels. The global shutter function is implemented by the previously discussed electronic shutter operation of the row scanning unit 213. The concurrency of the timings of the shutter operation, the exposure operation, and the signal transfer operations is important in the solid-state imaging device having the global shutter function. The reduction of the timing difference in the pixel drive signals vb1-vbm, i.e., the concurrent operation of all the pixels, is thus advisable.

The adjustment circuit 233 pre-stores delay information, i.e., the codes CODE1[x:1] through CODEm[X:1], for setting to be concurrent the timings of the pixel drive signals vb1-vbm supplied from the row scanning unit 213 via the connection unit 235. The delay information is a predictive value predicted through simulation or the like. More specifically, the delay information is set on the row scanning unit 213 taking into consideration the delay quantities of the activation and deactivation timings of the pixel drive signals vb1-vbm. The activation and deactivation timings of the pixel drive signals vb1-vbm are caused by the difference in the parasitic resistance and the parasitic capacitance depending on the length of the wiring line and the difference in the IR drop depending on the distance from the power source.

The variable delay circuits 2331-1 through 2331-m perform the timing-adjustment operation (tuning correction operation) on the pixel drive signals vb1-vbm in accordance with the delay quantities responsive to the codes CODE1[x:1] through CODEm[X:1] stored on the non-volatile memory 2332. The concurrent pixel drive signals vbD1-vbDm are output from the variable delay circuits 2331-1 through 2331-m. The pixel drive signals vbD1-vbDm are input to the pixel array 212 via the connection unit 235.

The tuning correction operation is performed on a per pixel row basis. Alternatively, the tuning correction operation may be performed on a pixel row group basis with each row group including a plurality of pixel rows. With the adjustment circuit 233 performing the tuning correction operation on a per pixel row basis or on a per pixel row group basis, the activation and deactivation timings of the pixel drive signals vbD1-vbDm input to the pixel array 212 are synchronized for concurrency.

Since shading in the vertical direction caused by a delay in the activation and deactivation timings in the vertical direction is controlled, image quality is increased. The solid-state imaging device having the global shutter function performs reliably an all-pixel concurrent operation. Image blurring caused by non-concurrency is reduced.

The first modification of the fifth embodiment is based on the solid-state imaging device having the global shutter function. The solid-state imaging device having the global shutter function is one example only. More specifically, the present invention is applicable to a solid-state imaging device having a rolling shutter (focal plane shutter) function in which the start and stop of exposure are set by successively scanning the rows of the unit pixels 220 in the pixel array 212.

The solid-state imaging device having the rolling shutter function is free from the all-pixel concurrent operation, which is performed on the solid-state imaging device having the global shutter function. In the solid-state imaging device having the rolling shutter function, each pixel row is to be driven at a predetermined timing. To this end, the variable delay circuits 2331-1 through 2331-*m* timing adjust the pixel drive signals vb1-vbm with a delay contained therein output from the row scanning unit 213 to result in pixel drive signals vbD1-vbDm having the predetermined timings.

6.2 Second Modification of the Fifth Embodiment

In accordance with the first modification of the fifth embodiment, the predictive value predicted through simulation or the like, namely, the codes CODE1[x:1] through CODEm[X:1] are pre-stored on the non-volatile memory 2332. If a measurement value greatly deviates from a predictive value because of variations from chip to chip with on codes CODE1[x:1] through CODEm[X:1] pre-stored on the non-volatile memory 2332, desired correction results may not be obtained.

In accordance with a second modification of the present invention, a monitor feedback function is incorporated. More specifically, a monitor circuit is added to the structure illustrated in FIG. 19 so that a signal transition timing is monitored in a manufacturing phase of the solid-state imaging device. In accordance with the monitored measurement value, an adjustment code is written onto the non-volatile memory 2332. The tuning correction operation is based on the actual measurement rather than the predictive value. The tuning correction (timing correction) operation results in high accuracy results in the vertical direction and the horizontal direction in comparison with the solid-state imaging device having no monitor feedback function. Chip-to-chip variations on the results are also controlled.

Figure 21:
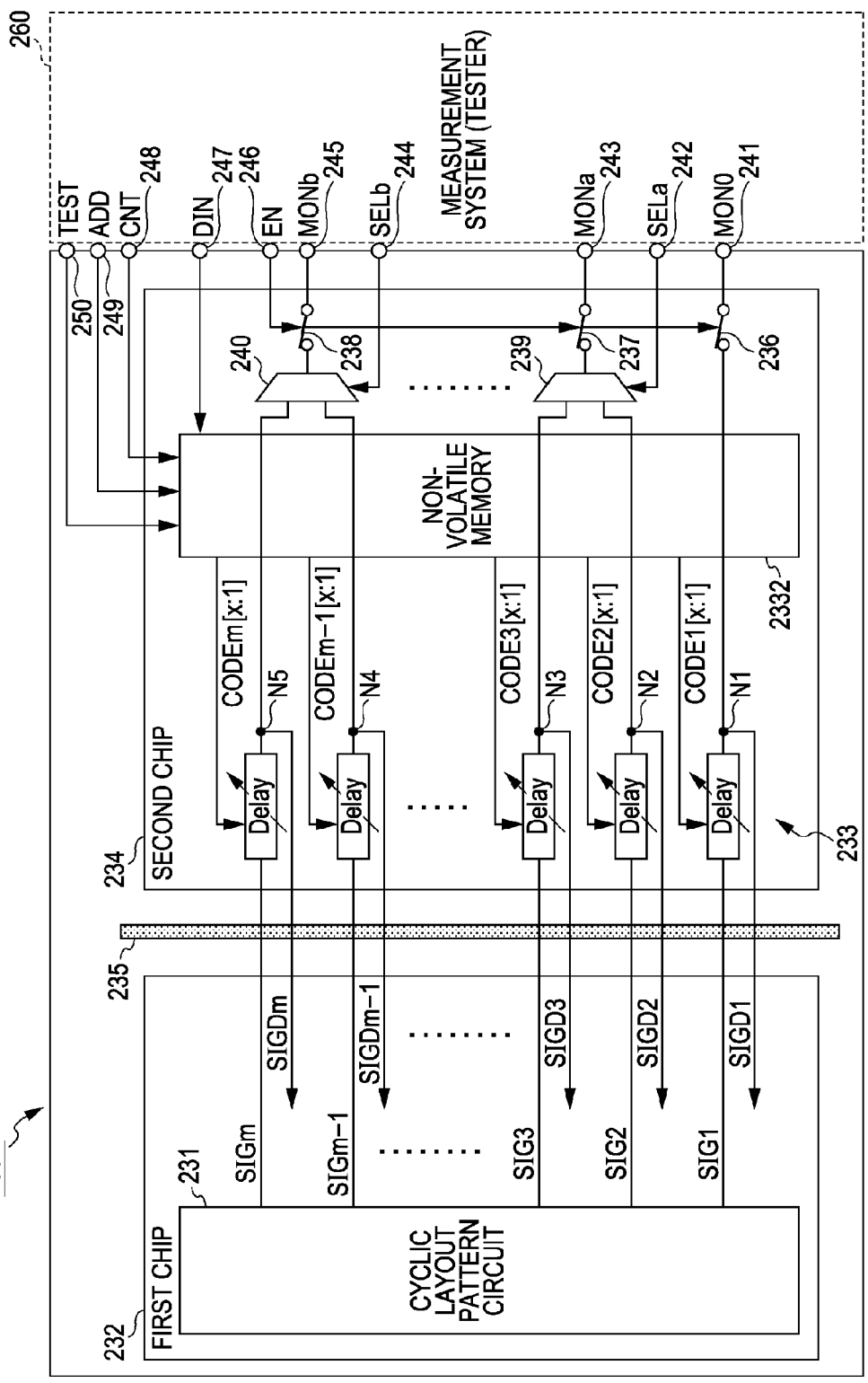
FIG. 21 is a system diagram of a solid-state imaging device in accordance with a second modification of the fifth modification.

FIG. 21 is a system diagram of a solid-state imaging device 230B in accordance with the second modification of the fifth modification. In FIG. 21, elements identical to those illustrated in FIG. 19 are designated with the same reference numerals and the discussion thereof is omitted here.

The solid-state imaging device 230B as the second modification of the fifth embodiment includes switches 236-238 and selectors 239 and 240 in addition to the elements illustrated in FIG. 19. The switch 236 is connected between an output node N1 of one of the variable delay circuits 2331-1 through 2331-*m*, for example, the variable delay circuit 2331-1, and a monitor pad (terminal) 241. The signal SIGD1 is output to the monitor pad 241 via the switch 236 as a reference signal monitoring a reference timing.

The selector 239 has two inputs respectively connected to nodes N2 and N3 of the variable delay circuits 2331-2 and 2331-3. The selector 239 selects one of the two inputs in response to a selection signal SELa supplied from a measurement system (such as a tester) 260 via a selection pad 242. The switch 237 is connected between the output terminal of the selector 239 and a monitor pad 243.

The selector 240 has two inputs respectively connected to nodes N4 and N5 of the variable delay circuits 2331-*m*−1 and 2331-*m*. The selector 240 selects one of the two inputs in response to a selection signal SELb supplied from the measurement system 260 via a selection pad 244. The switch 238 is connected between the output terminal of the selector 240 and a monitor pad 245.

The switches 236-238 are on (closed) and off (opened) controlled in response to an enable signal EN supplied from the measurement system 260 via an enable pad 246. Each of the signals SIGD2 and SIGD3 is supplied to the monitor pad 243 via the selector 239 and the switch 237 to monitor a deviation in timing of a reference signal in the vertical direction or the horizontal direction. Similarly, each of the signals SIGDm−1 and SIGDm−1 is supplied to the monitor pad 245 via the selector 240 and the switch 238.

The non-volatile memory 2332 receives code data DIN responsive to the delay quantity to be stored on a per pixel row basis or on a per pixel column basis from the measurement system 260 via a data input pad 247. The non-volatile memory 2332 further receives a control signal CNT, an address signal ADD, and a test signal TEST via pads 248, 249, and 250 respectively from the measurement system 260.

Wiring is designed so that the distance between the output node N1 and the switch 236, the distance between the output node N2 and the switch 237, and the distance between the output node N3 and the switch 237 are equal to each other. Wring is also designed so that the distance between the switch 236 and the monitor pad 241 is equal to the distance between the switch 237 and the monitor pad 243. Through the wirings, timing delays in the signals SIGD1-SIGD3 from the output nodes N1-N3 are thus equalized.

The wirings are the shortest possible in view of reducing a capacitive load to the signals SIGD1-SIGD3. To adjust the number of stages, a circuit having stages of the same number as the selector 239 is arranged between the switch 236 and the variable delay circuit 2331-1. It is assumed that the calibration of the measurement system 260 causes no timing shift to occur from the monitor pads 241 and 243.

In the above discussion, the signals SIGD1-SIGD3 have been representatively discussed. The monitor feedback function is not limited to the signals SIGD1-SIGD3. The above discussion is applied to any one of signals SIGD1-SIGDm.

The selectors 239 and 240 are not limited to two inputs. The number of inputs may be increased to three or more as long as the principle of the equal wiring length described above is observed. In such a case, the number of signals to be monitored increases, thereby resulting in a more accurate adjustment.

The number of pads such as the monitor pads 243 and 245 may be increased to within a permissible range of the number of pads (terminals or pins). In such a case, the number of concurrent monitors increases, and a test period of time is shorter than when the two monitor pads are used. With the number of monitor pads increased, equal length wiring is facilitated in the adjustment circuit 233.

Monitor Feedback Function

The monitor feedback function of the solid-state imaging device 230B as the second modification of the fifth embodiment is descried below. The monitor feedback function is performed by activating the signals SIGD1-SIGDm at a time and by monitoring on the measurement system 260 the transition timings of the signals output from the monitor pads 243 and 245 during a test operation in a manufacturing phase.

More specifically, the measurement system 260 determines a code synchronizing the transition timings of the signals SIGD2-SIGDm with respect to the transition timing of the signal SIGD1 by varying the delay quantities of the variable delay circuits 2331-1 through 2331-*m*. The code thus determined is supplied from the measurement system 260 to the non-volatile memory 2332 via the data input pad 247 for storage. The feedback of the measurement system 260 is thus used for correction.

Monitor Feedback Tuning Correction Operation

Figure 22:
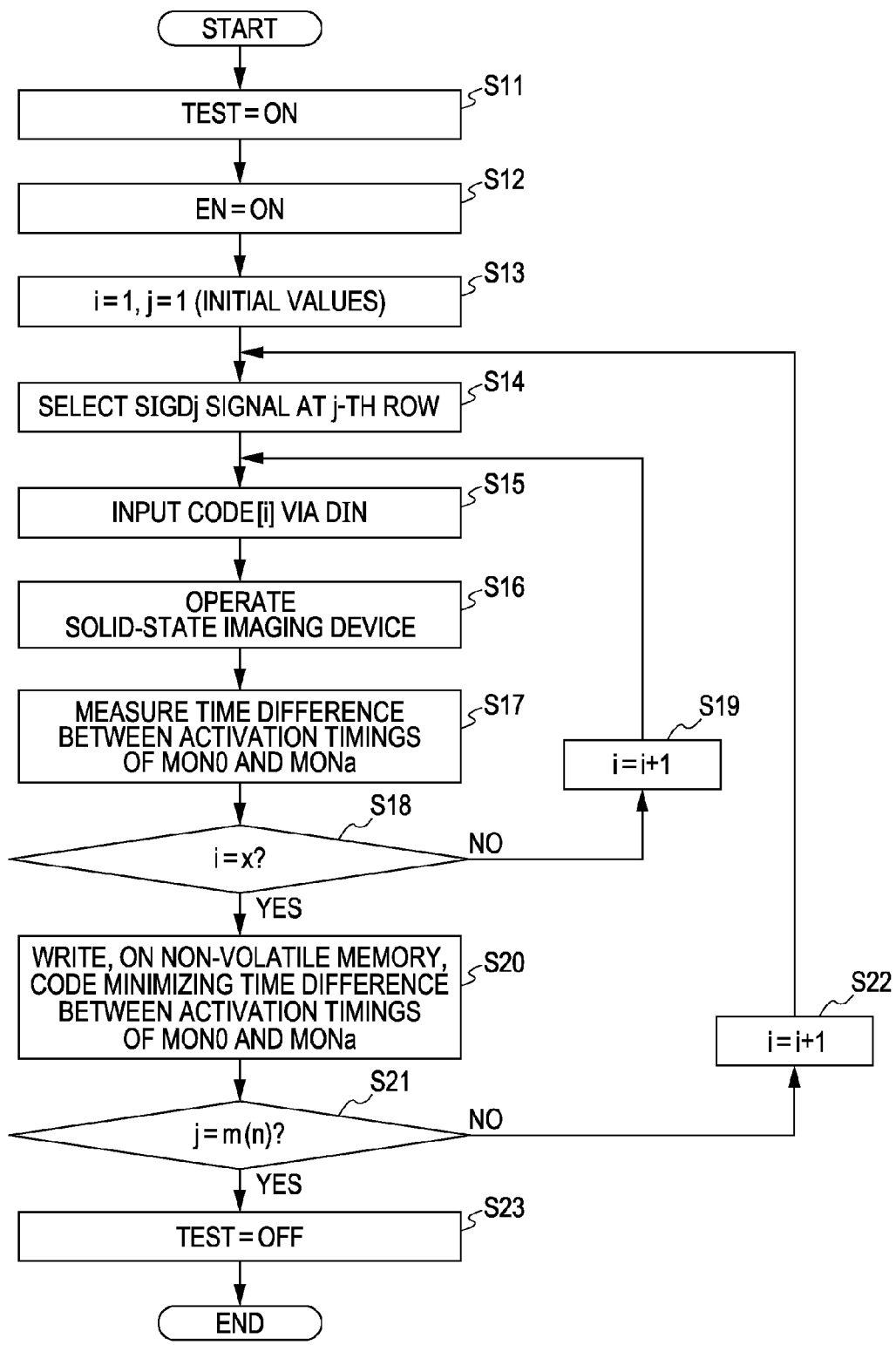
FIG. 22 is a flowchart of a monitor feedback tuning correction operation performed during a test operation in a manufacturing phase of the device.

Monitor feedback tuning correction operation in the manufacturing phase is described with reference to a flowchart illustrated in FIG. 22. A series of process steps of the operation is executed under the control of a controller in the measurement system 260, for example, a microcomputer.

The test signal TEST supplied via the pad 250 is set to be ON (active) (step S11). The enable signal EN supplied via the pad 246 is set to be ON (active). Initial values (i=1 and j=1) are set to parameters i and j (step S13). The selectors (239 and 240) select a signal SIGDj corresponding to a row j (step S14).

The CODE[i] is directly input via the pad 247 as the code of the variable delay circuits 2331-1 through 2331-$m$ (step S15). The solid-state imaging device 230B is then operated (step S16). With the solid-state imaging device 230B operating, the signals SIG1-SIGm are activated at a time. In this condition, a time difference in the activation timings of the signal SIGD1, and the signal SIGDj output via the monitor pads 241, and 243 (245) is measured (step S17).

The controller in the measurement system 260 determines whether i=x (x is the number of bits of the code divided by a delay adjustment value). In other words, the controller determines whether CODE[i] is input for all the codes (step S18). If i≠x, an operation for i=i+1 is executed (step S19). Processing returns to step S15 to input CODE[i+1] for another code.

If it is determined in step S18 that i=x, a code (the value of i) resulting in a minimum time difference between the activation timings of the signal SIGD1 and the signal SIGDj is written onto the non-volatile memory 2332 (step S20). The location to write the code thereon in the non-volatile memory 2332 is addressed by the address signal ADD and the control signal CNT.

The controller determines whether j=m(n), i.e., the tuning correction operation has been completed on all the rows (step S21). If j≠m(n), the controller executes an operation for j=j+1 (step S22). Processing returns to step S14 to perform the tuning correction operation for another row (column). If j=m (n), the controller sets the test signal TEST to be OFF (step S23), the series of process steps is thus completed.

The series of process steps is not limited to those described above. In the above discussion, processing of the code and the row (column) proceeds from small to large. If all the codes and all the rows (columns) are checked, any proceeding pattern is acceptable.

During a use phase of the solid-state imaging device, the code written on the non-volatile memory 2332 with the solid-state imaging device switched on is loaded onto the variable delay circuits 2331-1 through 2331-$m$ as the CODE[i]. In response to the loaded CODE[i], the delay quantities are set on the variable delay circuits 2331-1 through 2331-$m$.

Figure 23:
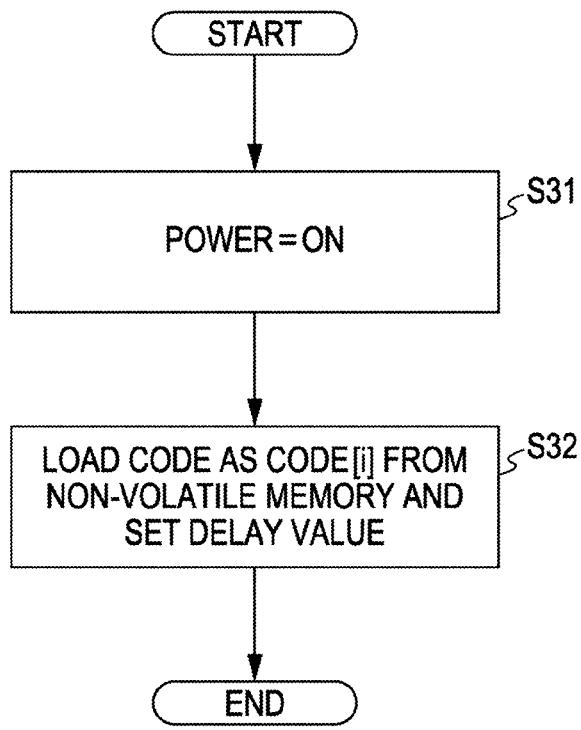
FIG. 23 is a flowchart of a tuning correction operation during a use phase of the device.

More specifically, as illustrated in a flowchart of FIG. 23, the code is loaded in step S32 as CODE[i] from the non-volatile memory 2332 at the moment the solid-state imaging device is powered on (step S31). In response to the loaded CODE[i], the delay quantities are set on the variable delay circuits 2331-1 through 2331-$m$. The individual timing adjustments are thus performed in response to the signals SIG1-SIGm output from the cyclic layout pattern circuit 231.

As described above, the solid-state imaging device 230B as the second modification of the fifth embodiment monitors the signal transition timing during the manufacturing phase, and writes the adjustment code on the non-volatile memory 2332 in response to the actual measurement value. The tuning correction operation is thus performed based on the actual measurement value rather than the predictive value. The tuning correction operation based on the actual measurement value permits a more accurate correction in the vertical direction and the horizontal direction than on the solid-state imaging device having no monitor feedback function. The tuning correction operation also accounts for variations from chip to chip.

6.3 Third Modification of the Fifth Embodiment

In accordance with the second modification of the fifth embodiment, a large number of pins (terminals or pads) are used to connect the adjustment circuit 233 to the measurement system (tester) 260. The pin number margin is small. If the number of pins permitted is limited to the number smaller than the number of rows or columns, it is difficult to connect the lines of equal length respectively to the rows or columns of pixels via the pins. It is possible to feedback monitor tune some of the rows or columns, but it is difficult to feedback monitor tune all the rows or columns.

In accordance with a third modification of the fifth embodiment, a testing circuit (measurement circuit) is incorporated into the adjustment circuit 233 to perform a built-in self test (BIST) rather than using the measurement system 260.

Figure 24:
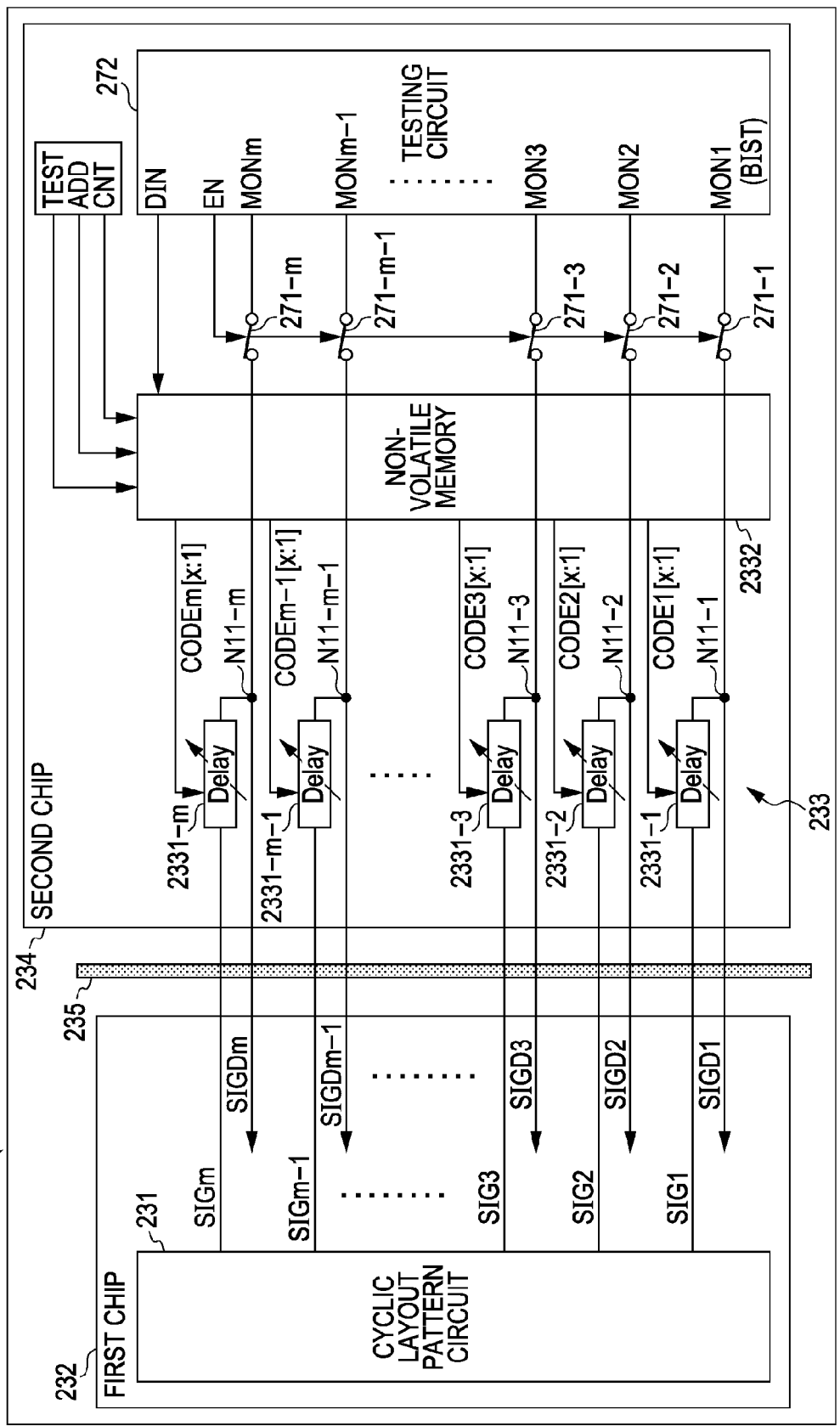
FIG. 24 is a system diagram illustrating a solid-state imaging device in accordance with a third modification of the fifth embodiment.

FIG. 24 is a system diagram illustrating a solid-state imaging device 230C in accordance with the third modification of the fifth embodiment. In FIG. 24, elements identical to those illustrated in FIG. 19 are designated with the same reference numerals and the discussion thereof is omitted here.

In the solid-state imaging device 230C as the third modification of the fifth embodiment, the adjustment circuit 233 includes switches 271-1 through 271-$m$ of the number of pixel rows (columns) and a testing circuit (BIST) 272. The switches 271-1 through 271-$m$ are connected between the output nodes N11-1 through N11-$m$ of the variable delay circuits 2331-1 through 2331-$m$ and test terminals of the testing circuit 272. The switches 271-1 through 271-$m$ are on-off controlled in response to an enable signal EN output from the testing circuit 272.

The testing circuit 272 as BIST is basically identical in function to the measurement system 260 of the second modification of the fifth embodiment. More specifically, the testing circuit 272 is included in the adjustment circuit 233, and the monitor feedback tuning correction operation is performed within the adjustment circuit 233. Since the testing circuit 272 has the BIST structure, the limitation on the number of pins is eliminated. The monitor feedback tuning correction operation for the number of rows or columns can be performed.

Even with the BIST structure with the testing circuit 272 included in the adjustment circuit 233, the number of monitors and thus the circuit scale is reduced by incorporating selectors as in the second modification of the fifth embodiment.

6.4 Fourth Modification of the Fifth Embodiment

In accordance with the first modification of the fifth embodiment, the row scanning unit 213 and the pixel array 212 are arranged on the same chip. In contrast, the row scanning unit 213 and the pixel array 212 are arranged on different substrates (chips) in accordance with a fourth modification of the fifth embodiment.

Figure 25:
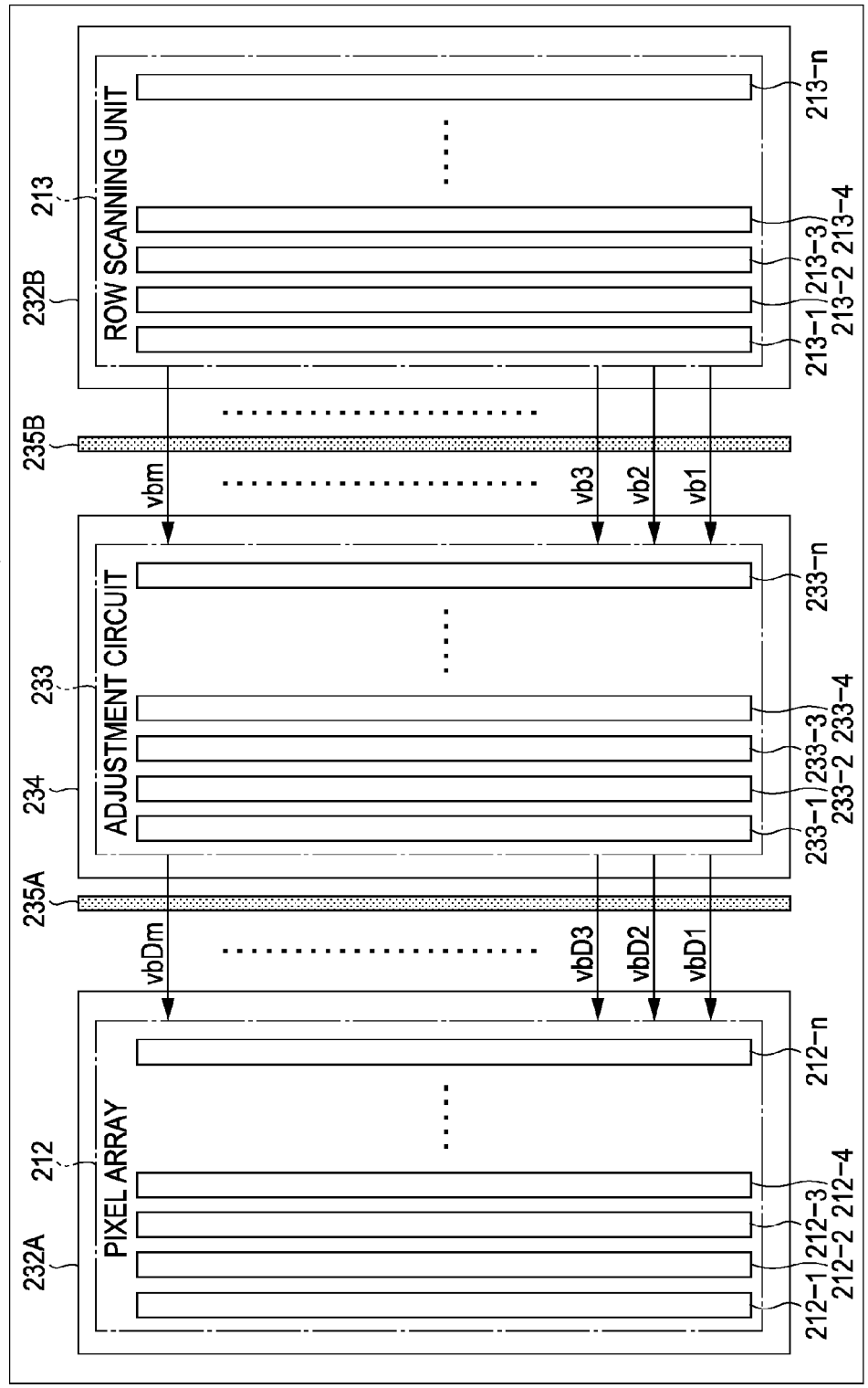
FIG. 25 is a system diagram illustrating a solid-state imaging device in accordance with a fourth modification of the fifth embodiment.

FIG. 25 is a system diagram illustrating a solid-state imaging device 230D in accordance with the fourth modification of the fifth embodiment. In FIG. 25, elements identical to those illustrated in FIG. 20 are designated with the same reference numerals and the discussion thereof is omitted here.

The solid-state imaging device 230D as the fourth modification of the fifth embodiment includes three chips (substrates) 232A, 234, and 232B successively laminated. The three chips 232A, 234, and 232B are electrically connected to each other through a three-dimensional connection.

More specifically, the pixel array 212 is formed in the chip 232A. The adjustment circuit 233 includes adjusters 233-1 through 233-$n$ corresponding to pixel columns 212-1 through 212-*n* of the pixel array 212, and is formed in the chip 234 different from the chip 232A. The chip 234 is laminated on the side of the chip 232A opposite the light incident side of the chip 232A.

The chip 232A and the chip 234 are laminated so that the adjusters 233-1 through 233-*n* are located respectively right beneath the pixel columns 212-1 through 212-*n*. The pixel columns 212-1 through 212-*n* in the chip 232A are respectively connected to the adjusters 233-1 through 233-*n* on a one-to-one correspondence relationship through a three-dimensional connection.

The row scanning unit 213 includes scanning sections 213-1 through 213-*n* corresponding in number to the adjusters 233-1 through 233-*n*, namely, to the pixel columns 212-1 through 212-*n* on the pixel array 212. The row scanning unit 213 is formed in the chip 232B different from the chip 232A and the chip 234.

The chip 234 and the chip 232B are laminated so that the scanning sections 213-1 through 213-*n* are located respectively right beneath the adjusters 233-1 through 233-*n*. The adjusters 233-1 through 233-*n* in the chip 234 are respectively connected to the scanning sections 213-1 through 213-*n* on the chip 232B on a one-to-one correspondence relationship through a three-dimensional connection.

Each of the adjusters 233-1 through 233-*n* is basically identical in structure to the adjustment circuit 233 illustrated in FIG. 20. The non-volatile memory 2332 may be shared by all the adjusters 233-1 through 233-*n* or one non-volatile memory 2332 may be shared by every group of adjusters 233.

The reason why the row scanning unit 213 includes the scanning sections 213-1 through 213-*n* identical in number to the pixel columns 212-1 through 212-*n* is described later.

The scanning sections 213-1 through 213-*n* have a one-to-one correspondence relationship with the pixel columns 212-1 through 212-*n*. Optionally, one scanning section 213-*i* may be commonly shared by every group of pixel columns out of the pixel columns 212-1 through 212-*n*.

Similarly, the adjusters 233-1 through 233-*n* on the adjustment circuit 233 do not necessarily have a one-to-one correspondence relationship with the scanning sections 213-*i*. The scanning sections 213-*i* may be divided into groups and each group is shared by an adjuster 233-*j*.

The solid-state imaging device 230D of the fourth modification of the fifth embodiment includes the three chips 232A, 234, and 232B which are successively laminated and mutually electrically connected through the three-dimensional connection. The following advantages are thus provided.

The adjusters 233-1 through 233-*n* in the adjustment circuit 233 perform the above-described tuning correction operation, thereby adjusting the activation and deactivation timings of the pixel drive signals vb1-vbm respectively output from the scanning sections 213-1 through 213-*n* of the row scanning unit 213. Through this timing adjustment, the activation and deactivation timings of the pixel drive signals vbD1-vbDm to be input to the pixel array 212 are set to be concurrent.

The chips 232A, 234, and 232B are laminated so that the scanning sections 213-1 through 213-*n* are respectively located right beneath the pixel columns 212-1 through 212-*n* with the chip 234 interposed therebetween. The distance between the pixels 220 in the pixel columns 212-1 through 212-*n* and the scanning sections 213-1 through 213-*n* driving the respective pixels 220 is shortened. More specifically, the distance between the pixels and the row scanning unit 213 here is substantially shorter than the distance provided by the pixel array 212 that transfers the pixel drive signals vb1-vbm through the pixel drive lines 217 from one side only as illustrated in FIG. 15.

The solid-state imaging device is thus free from the transfer delay and the waveform distortion due to the paretic capacitance caused in the pixel drive lines 217 that conduct the pixel drive signals vb1-vbm. The pixel drive signals vb1-vbm are then supplied to the unit pixels 220 without any delay.

The scanning sections 213-1 through 213-*n* are respectively arranged for the pixel columns 212-1 through 212-*n*. The scanning sections 213-1 through 213-*n* drive the respective pixels at a lower power than when one row scanning unit 213 drives all the pixel columns 212-1 through 212-*n*. This arrangement improves withstand voltage rating performance of each transistor forming the scanning sections 213-1 through 213-*n*.

The scanning sections 213-1 through 213-*n* giving off a large amount of heat during a pixel drive operation are formed in the chip 232B different from the chip 232A and are thus separated from the pixel columns 212-1 through 212-*n*. The effect of heat generated by the scanning sections 213-1 through 213-*n* on the unit pixels 220 is thus controlled. The solid-state imaging device is free from image quality degradation responsive to heat generation, and provides a high quality image.

In the fourth modification of the fifth embodiment, the cyclic layout pattern circuit 231 is the row scanning unit 213. The cyclic layout pattern circuit 231 is not limited to the row scanning unit 213. The advantages of the row scanning unit 213 are also equally provided if the cyclic layout pattern circuit 231 is applied to one of the column processor 214 (including the comparator 2141 and the counter 2142), the column scanning unit 215, and the constant current source connected to one end of the vertical signal line 218 for each pixel column.

6.5 Modifications

In accordance with the first through fourth modifications of the fifth embodiment, the variable delay circuits 2331-1 through 2331-*m* and the non-volatile memory 2332 are formed in the same chip 234. Optionally, the variable delay circuits 2331-1 through 2331-*m* and the non-volatile memory 2332 are formed in separate chips with the chips electrically connected via a three-dimensional connection.

The number of signals of codes CODE1 through CODEm output from the non-volatile memory 2332 is m (n for the number of columns) multiplied by x (delay adjustment value). A connection conducting the codes CODE1-CODEm has a three-dimensional structure. Forming the variable delay circuits 2331-1 through 2331-*m* and the non-volatile memory 2332 on the separate chips is effective in view of reducing a wiring area.

Figure 26:
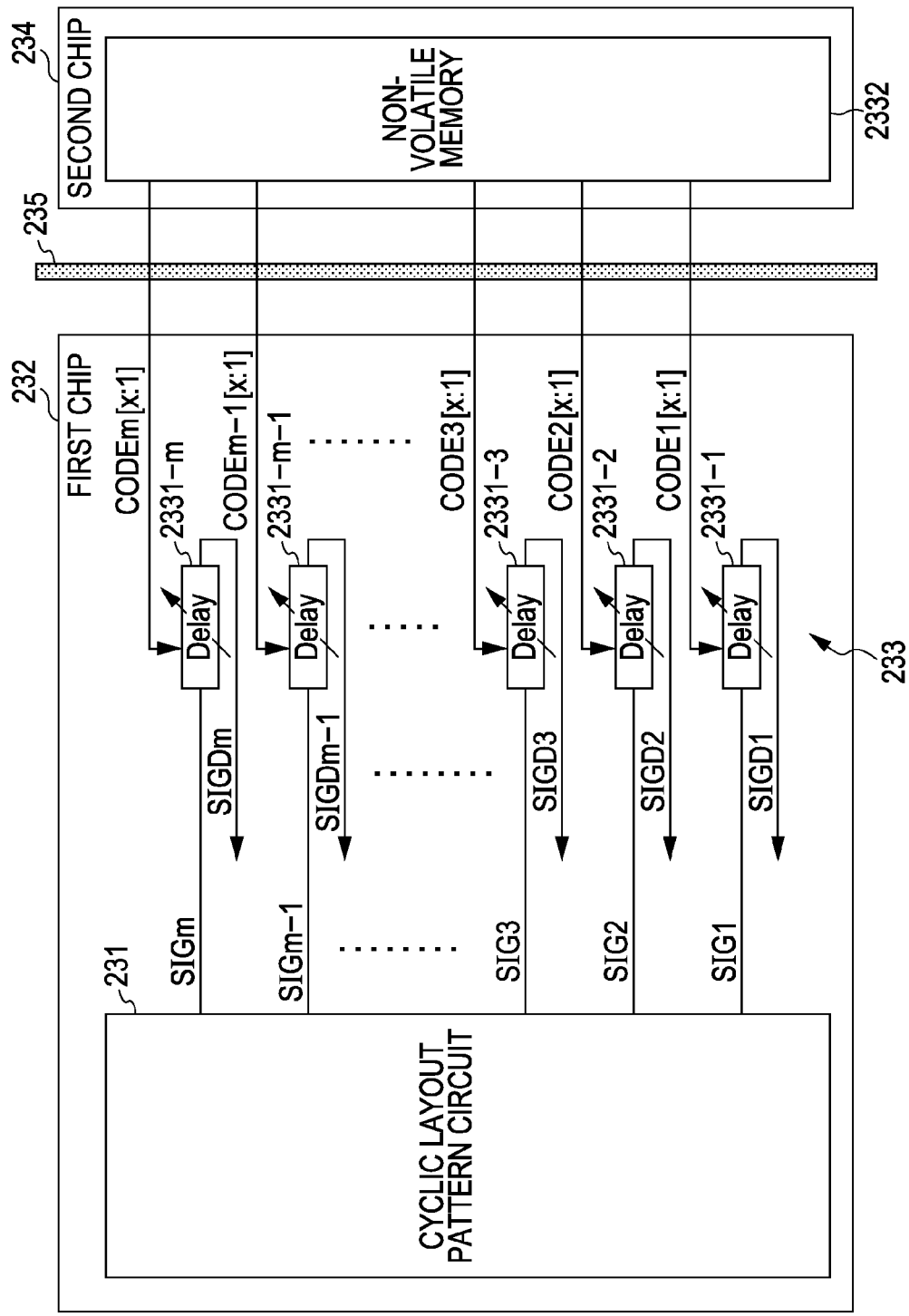
FIG. 26 is a system diagram illustrating a solid-state imaging device in accordance with one modification of the fifth embodiment.

FIG. 26 is a system diagram illustrating a solid-state imaging device in accordance with another modification of the fifth embodiment. Referring to FIG. 26, the variable delay circuits 2331-1 through 2331-*m* are formed in the first chip 232 and are electrically connected to the non-volatile memory 2332 in the second chip 234 via the three-dimensional connection unit 235. With this arrangement, the number of connections in the connection unit 235 increases to the number of rows multiplied by the number of codes CODE, but the wiring length of for nodes to be adjusted is minimized.

The second and third modifications of the fifth embodiment include in the adjustment circuit 233 the switches 236-238 and 271-1 through 271-*m* for monitoring. These monitoring switches may have a three-dimensional structure. Separating the variable delay circuits 2331-1 through 2331-*m* and the non-volatile memory 2332 from the monitoring switches in this way is effective in reducing a load capacitance caused in the monitoring switches.

7. Other Applications

In the preceding embodiments, the solid-state imaging device is applied to the CMOS image sensor. The present invention is not limited to the CMOS image sensor. The present invention is applicable to a typical solid-state imaging device including an array of rows and columns of unit pixels detecting a charge responsive to incident visible light and outputting the detected charge as an electrical signal.

The present invention is applicable to a solid-state imaging device which detects the distribution of an amount of incident visible light and captures the distribution as an image. The present invention is also applicable to a solid-state imaging device which detects the distribution of an amount of incident infrared light, X rays, particles, or the like, and captures the distribution as an image. In a broad sense, the present invention is also applicable to a solid-state imaging device (physical quantity distribution detector), such as a fingerprint detection sensor which detects pressure, static capacitance, or other physical quantity, and captures the physical quantity as an image.

The present invention is not limited to the solid-state imaging device that scans unit pixels in a pixel module on a per row basis, and reads a pixel signal from each unit pixel. The present invention is also applicable to an X-Y addressing solid-state imaging device that selects any pixel on a per pixel unit basis and reads a signal from the selected pixel on a per unit pixel basis.

The solid-state imaging device may have a one-chip structure. Alternatively, the solid-state imaging device has a modular structure in which a pixel module, and a signal processor or an optical system are packaged together.

8. Electronic Apparatuses

The solid-state imaging device of embodiments of the present invention is used in an electronic apparatus that employs a solid-state imaging device for an image capturing unit (photoelectric converting unit). The electronic apparatuses may include a camera system, such as a digital still camera or a video camera, a mobile terminal such as a cellular phone having an imaging function, and a copying device having the solid-state imaging device as an image reader. A module arranged in the electronic apparatus, namely, a camera module may also be referred to as an imaging apparatus.

Imaging Device

Figure 27:
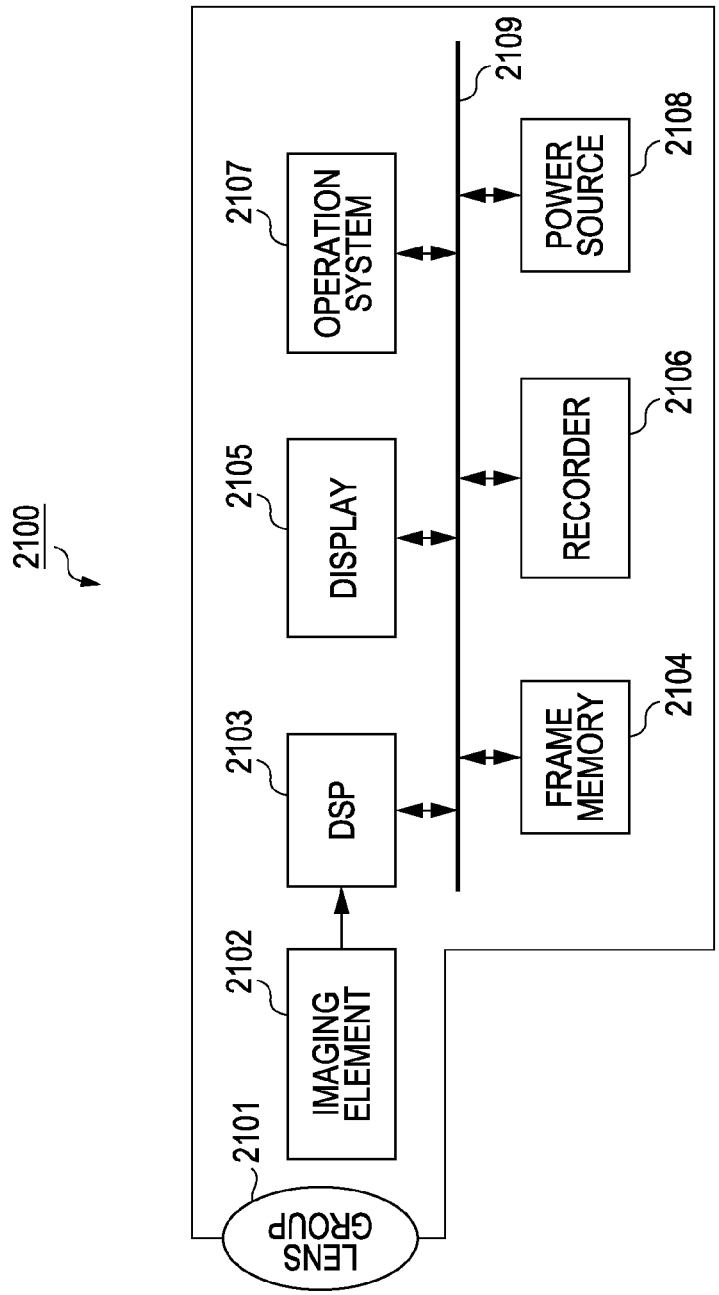
FIG. 27 is a block diagram illustrating an imaging device as an electronic apparatus of one embodiment of the present invention.

FIG. 27 is a block diagram illustrating an imaging device 2100 as an electronic apparatus of one embodiment of the present invention. Referring to FIG. 27, the imaging device 2100 includes an optical system including lens group 2101, imaging element 2102, DSP circuit 2103 as a camera signal processor, frame memory 2104, display 2105, recorder 2106, operation system 2107, power source 2108, etc. A bus line 2109 interconnects the DSP circuit 2103, the frame memory 2104, the display 2105, the recorder 2106, the operation system 2107, and the power source 2108.

The lens group 2101 focuses incident light from a subject (image bearing beam) to an image on an imaging surface of the imaging element 2102. The imaging element 2102 converts an amount of incident light focused by the lens group 2101 on a per pixel basis, and then outputs a pixel signal. One of the above-described solid-state imaging devices may be used for the imaging element 2102.

The display 2105 may be a panel-type display such as a liquid-crystal display or an organic electroluminescence (EL) display. The display 2105 displays a moving image or a still image captured by the imaging element 2102. The recorder 2106 records on a recording medium such as a video tape or a digital versatile disc (DVD) the moving image or the still image captured by the imaging element 2102.

Under the control of a user, the operation system 2107 sends an operation instruction for a variety of functions of the imaging device. The power source 2108 supplies power at a variety of levels to each of the DSP circuit 2103, the frame memory 2104, the display 2105, the recorder 2106, and the operation system 2107.

The imaging device 2100 may be used for the camera module for a video camera, a digital still camera, or a mobile terminal such as a cellular phone. The following advantages are provided if one of the above-described solid-state imaging devices is used for the imaging element 2102 in the imaging device 2100.

The multi-point tuning correction operation is performed on a pixel row basis, on a pixel column basis, on a pixel row group basis, or on a pixel column group basis. The generation of shading in the vertical direction and the horizontal direction is thus controlled. The imaging device 2100 with the solid-state imaging device used for the imaging element 2102 provides an excellent image free from shading.

The present application contains subject matter related to that disclosed in Japanese Priority Patent Application JP 2009-072575 filed in the Japan Patent Office on Mar. 24, 2009, and that disclosed in Japanese Priority Patent Application JP 2009-153620 filed in the Japan Patent Office on Jun. 29, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device, comprising:
    a first substrate including a plurality of pixels arranged in rows and columns, each pixel including (a) a light sensing unit generating a signal charge responsive to an amount of received light and (b) a plurality of MOS transistors reading the signal charge generated by the light sensing unit and outputting the read signal charge as a pixel signal;
    a second substrate including a plurality of pixel drive circuits supplying desired drive pulses to the pixels, a timing circuit, and a control circuit, wherein the first substrate is stacked on the second substrate in a manner such that each pixel drive circuit is arranged beneath a plurality of the MOS transistors formed in the first substrate and such that each pixel drive circuit is not beneath the light sensing unit, and wherein the timing circuit and the control circuit are not beneath any one of the pixels formed in the first substrate; and
    a connection unit, wherein the connection unit electrically connects the pixels of the first substrate to the pixel drive circuits of the second substrate arranged beneath the MOS transistors.

2. The solid-state imaging device according to claim 1, wherein the first substrate is arranged on a light incident side of the solid-state imaging device and wherein the second substrate is arranged on the side opposite the light incident side.

3. The solid-state imaging device according to claim 2, wherein the pixel drive circuits are arranged in a manner such that one pixel drive circuit drives a plurality of pixels.

4. The solid-state imaging device according to claim 3, wherein the light sensing unit is formed in a substrate arranged on a light incident side of the first substrate, wherein a plurality of wiring layers containing gate electrodes of the plurality of MOS transistors are formed on a side opposite a light incident side of the substrate, and wherein the connection unit is formed on the side of the wiring layers.

5. The solid-state imaging device according to claim 4, wherein the connection unit is formed of one of a micro-bond and a through via formed in the first substrate and the second substrate.

6. The solid-state imaging device according to claim 2, wherein the pixel drive circuits are arranged in a manner such that one pixel drive circuit drives one column of pixels or a plurality of columns of pixels.

7. The solid-state imaging device of claim 1, wherein each pixel drive circuit extends beneath a plurality of pixels corresponding to all of the pixels included in one of the columns of the pixels.

8. The solid-state imaging device of claim 1, wherein each pixel further includes a floating diffusion region and a charge storage capacitance between the light sensing unit and the floating diffusion.

9. The solid-state imaging device of claim 8, wherein the plurality of MOS transistors include a first transfer transistor and a second transfer transistor, wherein a source of the first transfer transistor is connected to an anode of the light sensing unit, wherein a drain of the first transfer transistor is connected to the charge storage capacitance, wherein a source of the second transfer transistor is connected to the charge storage capacitance, and wherein a drain of the second transfer transistor is connected to the floating diffusion region.

10. The solid-state imaging device of claim 9, wherein a plurality of MOS transistors further includes a reset transistor, an amplifying transistor, a selection transistor, and a light-receiving reset transistor.

11. The solid-state imaging device of claim 9, wherein the second substrate further includes a horizontal drive circuit.

12. The solid-state imaging device of claim 11, wherein the second substrate further includes an output circuit.

13. The solid-state imaging device of claim 1, wherein the second substrate further includes a column signal processing circuit.

14. The solid-state imaging device of claim 1, wherein the light sensing unit is on a light incident side of the first substrate.

15. An electronic apparatus, comprising:
an optical lens;
a solid-state imaging device, the solid-state imaging device including (1) a first substrate including a plurality of pixels arranged in rows and columns, each pixel including (a) a light sensing unit generating a signal charge responsive to an amount of light received through the optical lens and (b) a plurality of MOS transistors reading the signal charge generated by the light sensing unit and outputting the read signal charge as a pixel signal; (2) a second substrate including a plurality of pixel drive circuits supplying desired drive pulses to the pixels, a timing circuit, and a control circuit, wherein the first substrate is stacked on the second substrate such that each pixel drive circuit is arranged beneath a plurality of the MOS transistors formed in the first substrate and such that each pixel drive circuit is not beneath the light sensing unit, and wherein the timing circuit and the control circuit are not beneath any one of the pixels formed in the first substrate; and (3) a connection unit, wherein the connection unit electrically connects the pixels of the first substrate to the pixel drive circuits of the second substrate arranged beneath the MOS transistors; and
a signal processing circuit for processing a signal output from the solid-state imaging device.

16. The electronic apparatus of claim 15, wherein, each pixel drive circuit extends beneath a plurality of pixels corresponding to all of the pixels included in one of the columns of the pixels.

17. The electronic apparatus of claim 15, wherein each pixel further includes a floating diffusion region and a charge storage capacitance between the light sensing unit and the floating diffusion.

18. The electronic apparatus of claim 17, wherein the plurality of MOS transistors include a first transfer transistor and a second transfer transistor, wherein a source of the first transfer transistor is connected to an anode of the light sensing unit, wherein a drain of the first transfer transistor is connected to the charge storage capacitance, wherein a source of the second transfer transistor is connected to the charge storage capacitance, and wherein a drain of the second transfer transistor is connected to the floating diffusion region.

19. The electronic apparatus of claim 18, wherein a plurality of MOS transistors further includes a reset transistor, an amplifying transistor, a selection transistor, and a light-receiving reset transistor.

20. The electronic apparatus of claim 15, wherein the second substrate further includes a column signal processing circuit.

21. The electronic apparatus of claim 20, wherein the second substrate further includes a horizontal drive circuit.

22. The electronic apparatus of claim 21, wherein the second substrate further includes an output circuit.

23. The electronic apparatus of claim 15, wherein the light sensing unit is on a light incident side of the first substrate.

* * * * *